(12) United States Patent
Shamsi et al.

(10) Patent No.: US 10,224,819 B2
(45) Date of Patent: Mar. 5, 2019

(54) RIPPLE CANCELING IN POWER CONVERSIONS CIRCUITS

(71) Applicant: The Curators of the University of Missouri, Columbia, MO (US)

(72) Inventors: Pourya Shamsi, Rolla, MO (US); Mehdi Ferdowsi, Washington, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 15/909,584

(22) Filed: Mar. 1, 2018

(65) Prior Publication Data
US 2018/0269791 A1 Sep. 20, 2018

Related U.S. Application Data

(60) Provisional application No. 62/472,936, filed on Mar. 17, 2017.

(51) Int. Cl.
| | |
|---|---|
| *H02M 7/48* | (2007.01) |
| *H02M 3/335* | (2006.01) |
| *H02M 3/157* | (2006.01) |
| *H02M 3/158* | (2006.01) |
| *H02M 7/483* | (2007.01) |

(Continued)

(52) U.S. Cl.
CPC ....... *H02M 3/33507* (2013.01); *H02M 1/084* (2013.01); *H02M 3/07* (2013.01); *H02M 3/157* (2013.01); *H02M 3/158* (2013.01); *H02M 3/33576* (2013.01); *H02M 7/483* (2013.01); *H02M 7/538* (2013.01); *H03M 5/08* (2013.01); *H02M 1/15* (2013.01);

(Continued)

(58) Field of Classification Search
CPC . H02M 2001/0048; H02M 2001/0054; H02M 2001/0058; H02M 1/4241; H02M 2007/4815; H02M 7/4826; H02M 2007/4811; H02M 2007/4818; H02M 2007/4822; H02M 3/005
USPC ......... 363/21.02, 21.03, 40, 71, 95, 97, 120, 363/129, 131, 135, 137
See application file for complete search history.

(56) References Cited

U.S. PATENT DOCUMENTS 9,419,522 B1 * 8/2016 Khaligh ............. H02M 3/1582
2015/0303788 A1 * 10/2015 Leu .................... H02M 1/44
363/84

(Continued)

OTHER PUBLICATIONS

Scott, Mark J., A Gallium Nitride Switched-Capacitor Power Inverter for Photovoltaic Applications, 2012 Twenty-Seventh Annual IEEE Applied Power Electronics Conference and Exposition (APEC), Feb. 2012, pp. 46-52.

(Continued)

*Primary Examiner* — Alex Torres-Rivera
(74) *Attorney, Agent, or Firm* — Stinson Leonard Street LLP

(57) ABSTRACT

A power circuit substantially canceling ripples at the source. The power circuit includes a switching circuit configured to control a power flow between an input and an output, a main storage element electrically connected in series with the switching circuit, and a resonant tank electrically coupled to the switching circuit and configured to compensate for switching ripples in the main storage element. Aspects of the invention can be applied to a converter circuit or to an inverter circuit.

13 Claims, 11 Drawing Sheets

(51) Int. Cl.
    *H02M 1/084*     (2006.01)
    *H03M 5/08*     (2006.01)
    *H02M 3/07*     (2006.01)
    *H02M 7/538*     (2007.01)
    *H02M 1/15*     (2006.01)
    *H02M 1/00*     (2006.01)

(52) U.S. Cl.
    CPC .. *H02M 2001/0058* (2013.01); *Y02B 70/1425* (2013.01); *Y02B 70/1441* (2013.01); *Y02B 70/1491* (2013.01)

(56) References Cited

U.S. PATENT DOCUMENTS

| | | | | |
|---|---|---|---|---|
| 2015/0365003 | A1* | 12/2015 | Sadwick | H02M 3/28 363/21.01 |
| 2017/0331386 | A1* | 11/2017 | Babazadeh | H02M 1/08 |
| 2018/0138804 | A1* | 5/2018 | Kress | H02M 1/14 |

OTHER PUBLICATIONS

Zhou, Yan, A Single-Phase PV Quasi-Z-Source Inverter With Reduced Capacitance Using Modified Modulation and Double-Frequency Ripple Suppression Control, IEEE Transactions on Power Electronics, vol. 31, No. 3, Mar. 2016, pp. 2166-2173.

Martinelli, Robert, Coupled Inductor Boost Converter With Input and Output Ripple Cancellation, Conference Proceedings Applied Power Electronics Conference and Exposition, APEC '91, Mar. 1991, pp. 567-572.

Hamill, David C., A Zero Ripple Technique Applicable to Any DC Converter, 30th Annual IEEE Power Electronics Specialists Conference, Jul. 1999 IEEE, pp. 1165-1171.

Gu, Yu, Input/Output Current Ripple Cancellation and RHP Zero Elimination in a Boost Converter Using an Integrated Magnetic Technique, IEEE Transactions on Power Electronics, vol. 30., No. 2, Feb. 2015, pp. 747-756.

Schutten, Michael J., Ripple Current Cancellation Circuit, Applied Power Electronics Conference and Exposition, APEC '03, Feb. 2003, pp. 464-470.

* cited by examiner

RIPPLE CANCELING IN POWER CONVERSIONS CIRCUITS

CROSS-REFERENCE TO RELATED APPLICATIONS

This application claims priority from U.S. Provisional Patent Application Ser. No. 62/472,936, filed Mar. 17, 2017, entitled "ULTRA-LOW RIPPLE INVERTERS AND ZERO FUNDAMENTAL RIPPLE CONVERTERS FOR DISTRIBUTED GENERATION APPLICATIONS." The entire contents of the above-identified application are expressly incorporated herein by reference, including the contents and teachings of any references contained therein.

STATEMENT REGARDING FEDERALLY SPONSORED RESEARCH OR DEVELOPMENT

This invention was made with government support under DE-EE0006521-M008 (Subaward 2014-0654-18) awarded by the U.S. Department of Energy. The government has certain rights in the invention.

BACKGROUND

Massive integration of distributed energy resources has resulted in a demand for miniaturized power conversion circuits (e.g., inverter topologies, etc.) with minimal requirements for filtering elements. Switching converters rely on the switching between multiple modes of operation to generate a desired output. Conventional power electronic converters utilize semiconductor switches to generate a voltage pattern to be filtered by inductors and capacitors. Although these conventional switching converters are simple and require a low number of components, they output large ripples. To reduce the ripples, bulky inductors and capacitors are required.

Conventionally, ripples induced in switching converters are filtered using LC or LCL filters. Although this method of filtering switching ripples is effective and low cost, it cannot provide ripple-free voltage and current signals. Additionally, if low ripple outputs are of interest, the size of the converter will increase due to the requirements for larger filtering elements. Unlike traditional applications, modern power converters are expected to be small, low cost, and offer lighter weights while maintaining low input/output ripples and high efficiency.

Another challenge with conventional switching converters is the utilization of electrolyte capacitors. These capacitors are the first cause of failure in switching converters. An average life span of an industrial grade electrolyte capacitor is 5 to 7 years. However, the remaining circuit components, including the semiconductor switches, offer more than 30 years of life expectancy on average. Hence, systems (e.g., solar energy systems, etc.) including conventional switching converters that utilize electrolyte capacitors have their expected life spans reduced to less than 10 years, which can jeopardize the return-on-investment analysis. Hence, power conversion circuits with minimal filtering capacitors are of interest.

SUMMARY

Aspects of the present disclosure describe power conversion circuits (e.g., converters, inverters, etc.) that utilize a coupled inductor to cancel current and voltage ripples generated by switches within the circuits. By canceling ripples at the source instead of filtering them, the power conversion circuits described herein require fewer passive elements that conventional techniques (e.g., less cost, smaller physical size, etc.) and provide output voltages having improved quality, for example.

In an aspect, a power circuit includes a switching circuit, a main storage element, and a resonant tank. The switching circuit is configured to control a power flow between an input and an output. The main storage element is electrically connected in series with the switching circuit. The resonant tank is electrically coupled to the switching circuit and configured to compensate for switching ripples in the main storage element.

In another aspect, a power conversion circuit includes an input terminal, a coupled inductor, a switching circuit, and an output terminal. The input terminal is configured to receive a direct current. The coupled inductor is electrically coupled to the input terminal and has an inherent magnetizing inductance. The switching circuit is electrically coupled to the coupled inductor and is configured to alternate the flow of the direct current through a first winding of the coupled inductor to produce an alternating current in a second winding of the coupled inductor. The alternating current has a first phase. The output terminal is electrically coupled to the coupled inductor and is configured to provide the alternating current. The inherent magnetizing inductance of the coupled inductor is configured to compensate for ripples in the alternating current caused by the alternating flow of the direct current through the first winding of the coupled inductor. In this manner, the alternating current is substantially rippleless (e.g., without ripples) at the first output terminal.

A method of canceling current ripples in accordance with yet another aspect of the present disclosure includes receiving an electrical direct current at a coupled inductor via an input terminal. A direction of the flow of the electrical direct current is switched through a first winding of the coupled inductor to generate an electrical alternating current in a second winding of the coupled inductor. An inherent magnetizing inductance of the coupled inductor compensates for ripples in the electrical alternating current caused by the switching. The compensated electrical alternating current is provided at an output terminal of the coupled inductor.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Existing power inverters utilize switching topologies such as two-or-multi-level topologies to generate a sinusoidal voltage. Pulse width modulation is a method for modulating the reference signal on a train of pulses with a much higher frequency than the reference signal itself. The output of this modulation is supplied to the power stage of the inverter to generate a train of voltage pulses. As a result, the voltage generated by the inverter has to be filtered so that the high frequency pulses are removed and the reference signal is extracted. This filter is often a LC or a LCL filter. However, filtering will not eliminate this ripple and the output voltage suffers from switching harmonics. Ripple-canceling topologies as disclosed herein take another route. Instead of filtering the ripples, aspects of the present disclosure cancel the ripples at the source. This significantly reduces the amount of passive elements that are required and improves the quality of the output voltage.

ZFR Inverters

Figure 1:
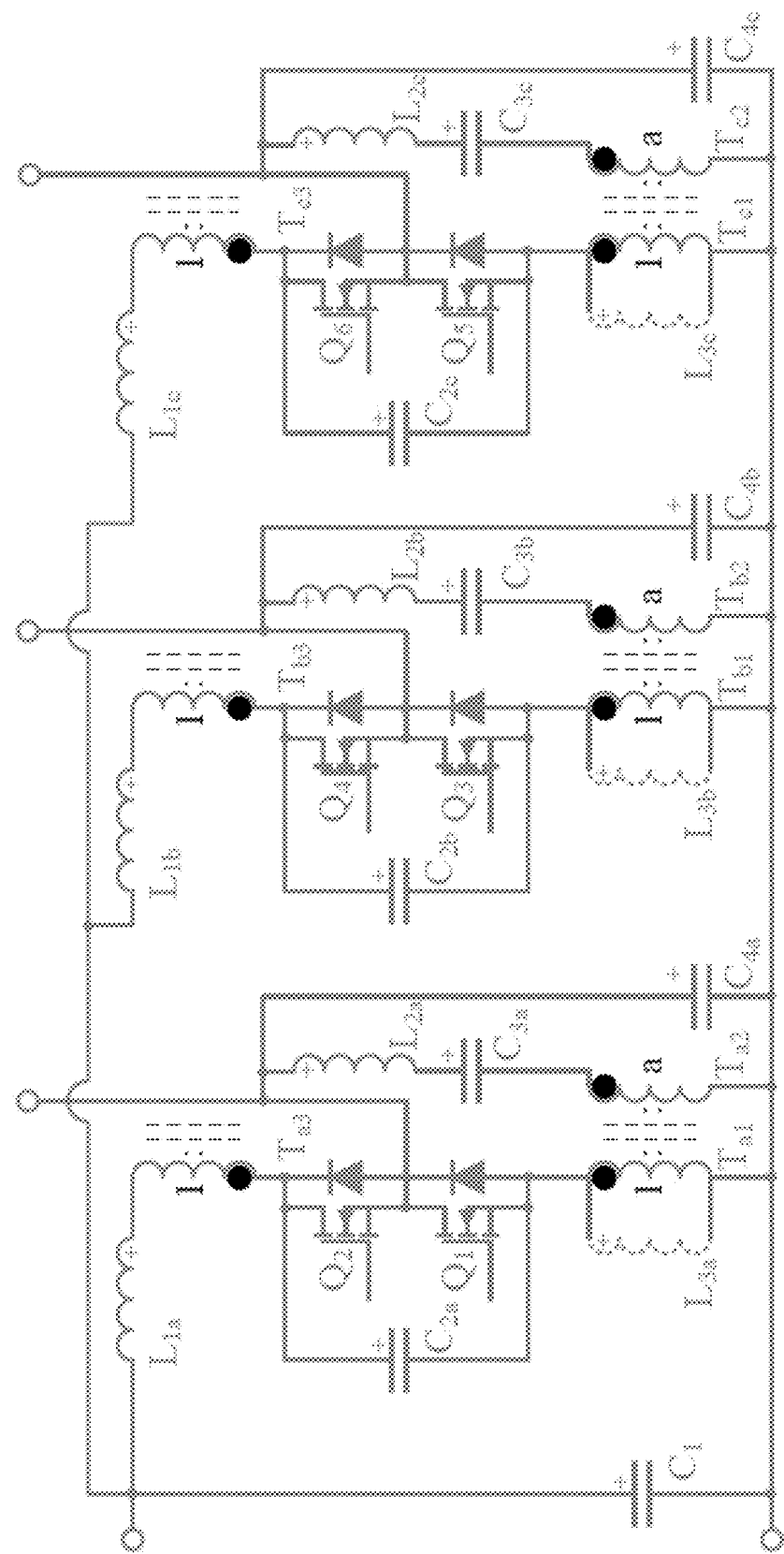
FIG. 1 illustrates a schematic of a three-phase ZFR converter according to an embodiment.

In this section, single and three phase ZFR inverters are described. A ZFR inverter in accordance with an aspect of the disclosure is designed by extending the traditional inverter leg topology using voltage and current ripple cancellation tanks. In this manner, a coupled inductor creates voltage and current ripples with similar amplitudes and opposite signs to cancel the ripples induced by the switching function. The schematic of the ZFR inverter is shown in FIG. 1. The ZFR inverter includes a DC bus capacitor ($C_1$), filtering inductors ($L_{1a}$, $L_{1b}$, $L_{1c}$), main transformers (i.e., coupled inductors) ($T_{a3}$, $T_{b3}$, $T_{c3}$, $T_{a1}$, $T_{b1}$, $T_{c1}$, $T_{a2}$, $T_{b2}/T_{c2}$), switching transistors ($Q_2$, $Q_4$, $Q_6$, $Q_1$, $Q_3$, $Q_5$), floating-dc-link capacitors ($C_{2a}$, $C_{2b}$, $C_{2c}$), diodes, output ripple canceling inductors ($L_{2a}$, $L_{2b}$, $L_{2c}$), output ripple canceling capacitors ($C_{3a}$, $C_{ab}$, $C_{3c}$), magnetizing inductors ($L_3L_{3b}$, $L_{3c}$), and high-frequency ripple filter capacitors ($C_{4a}$, $C_{4b}$, $C_{4c}$).

Unlike traditional inverters, the ZFR inverter of FIG. 1 does not have a filtering inductor on the phase outputs and the main inductors are the magnetizing inductance of the phase transformers (i.e., $L_{3a}$, $L_{3b}$, and $L_{3c}$) which are illustrated by a dashed line. In practice, these inductors are formed within the transformers and no external inductors are required. These magnetizing inductors are inherent to each transformer and are present due to the non-ideality of the transformer. $L_{1p}$ and $L_{2p}$ will cancel the impacts of $L_{3p}$, where p is an arbitrary phase.

This converter does not have any significant input/output current/voltage ripples. In a practical implementation, exact matching of inductive elements cannot be achieved. Hence, the high-frequency ripple filter capacitors (i.e., $C_{4a}$, $C_{4b}$, and $C_{4c}$) are added to filter the high frequency ripples on the phase outputs. Selection of these capacitors depends on the accuracy of the design of the coupled inductor. A suitable value is in the range of 0.1 to 1 µF. The dc bus capacitor $C_1$ has a similar situation. In an embodiment, this capacitor is not needed and is included to compensate for the non-ideal coupling of transformers $T_{p1}$ and $T_{p3}$, where p is an arbitrary phase.

The filtering inductors ($L_1 L_{1b}$, $L_{1c}$) increase the inductance of the DC-bus connection path to enforce the appearance of transformer magnetizing inductance on the fictitious $L_{3p}$, where p is an arbitrary phase. Each main transformer set (i.e., $T_{p1}$, $T_{p2}$, $T_{p3}$, where p is an arbitrary phase) forms a three-port coupled inductor that functions as the main ripple-canceling mechanism of each arbitrary phase p. Pairs of the switching transistors (i.e., $Q_1$:$Q_2$, $Q_3$:$Q_4$, $Q_5$:$Q_6$) form the switching inverter legs of phases a, b, and c, respectively. The floating-dc-link capacitors provide a locally floating dc-bus for each phase. The floating-dc-link capacitor $C_{2p}$ aids canceling the dc-bus ripples by providing a net voltage of zero across $L_{1p}$, where p is an arbitrary phase. Each diode of the ZFR inverter is the freewheeling diode of each switch $Q_i$, where i is an arbitrary number from 1 to 6. The output ripple canceling inductors $L_{2p}$ generate a canceling ramp current that cancels the ramp generated by the magnetizing inductor $L_{3p}$, where p is an arbitrary phase. The output ripple canceling capacitors $C_{3p}$ provide a locally floating voltage equivalent to the output voltage such that $L_{2p}$ forms a canceling current ramp, where p is an arbitrary phase.

Figure 2:
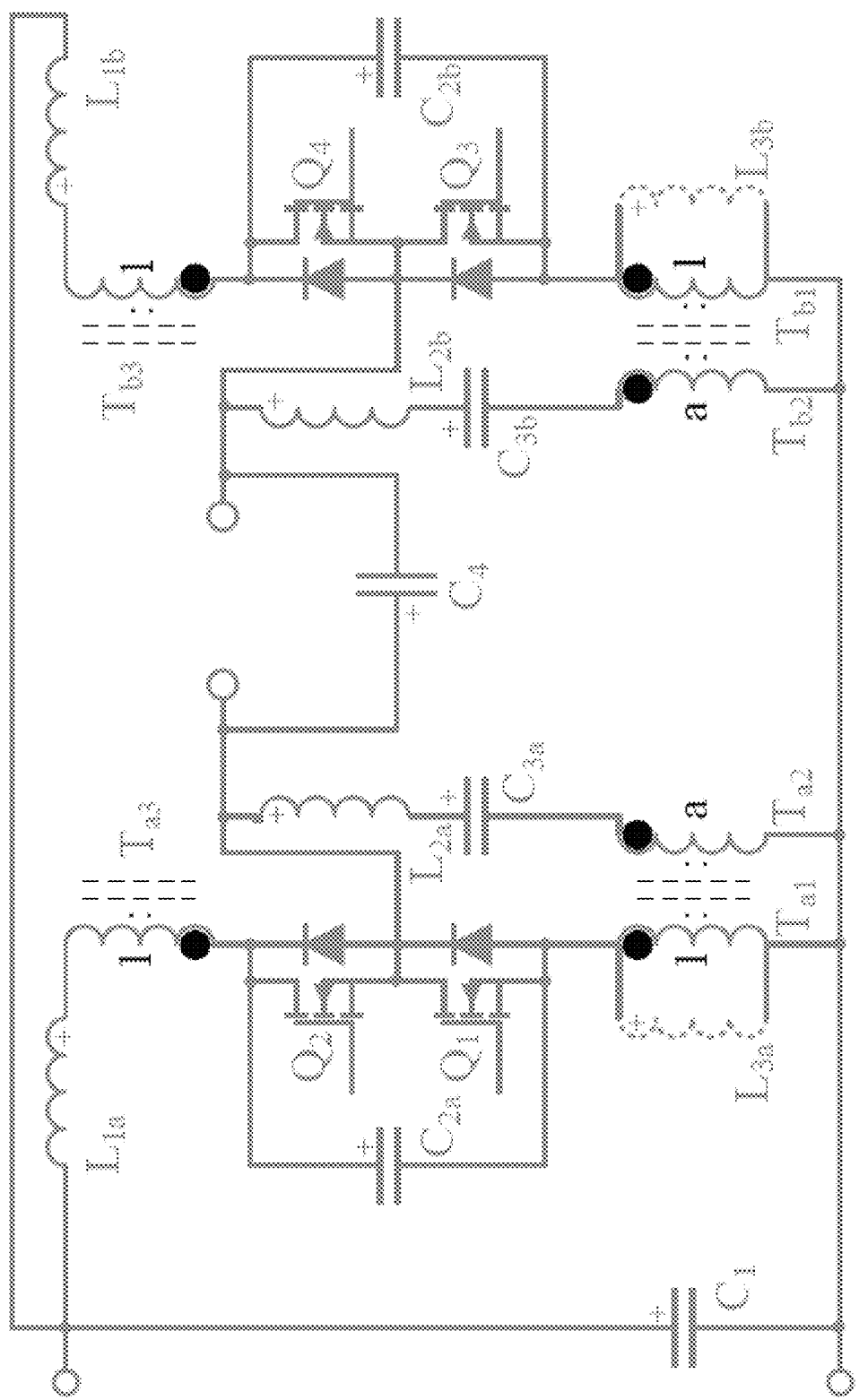
FIG. 2 illustrates a schematic of a single-phase ZFR converter having two ZFR legs according to an embodiment.
Figure 3:
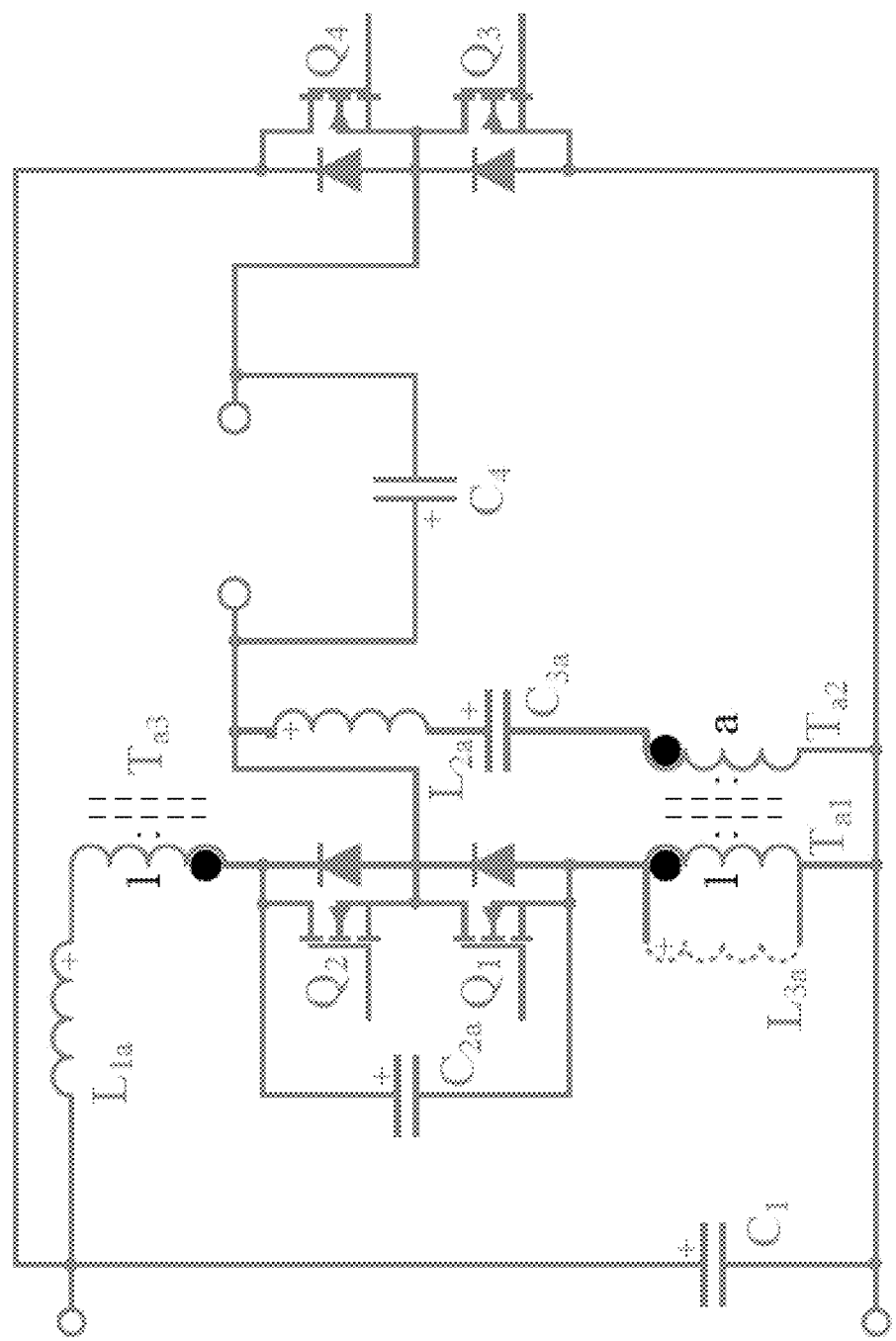
FIG. 3 illustrates a schematic of a single-phase ZFR converter having one ZFR leg according to an embodiment.

A ZFR single phase converter has a similar structure. Instead of three ZFR legs, two ZFR legs are utilized to form a single phase converter as shown in FIG. 2. In another approach, one ZFR leg and one standard leg are utilized to eliminate the extra components, as shown in FIG. 3. In this embodiment of FIG. 3, the PWM is applied to the ZFR leg while the standard leg is only for switching between the positive and negative half-waves. In a single-phase ZFR inverter, dc bus capacitor $C_1$ cannot be eliminated because this capacitor provides the single phase 120 Hz power ripple.

Figure 4A:
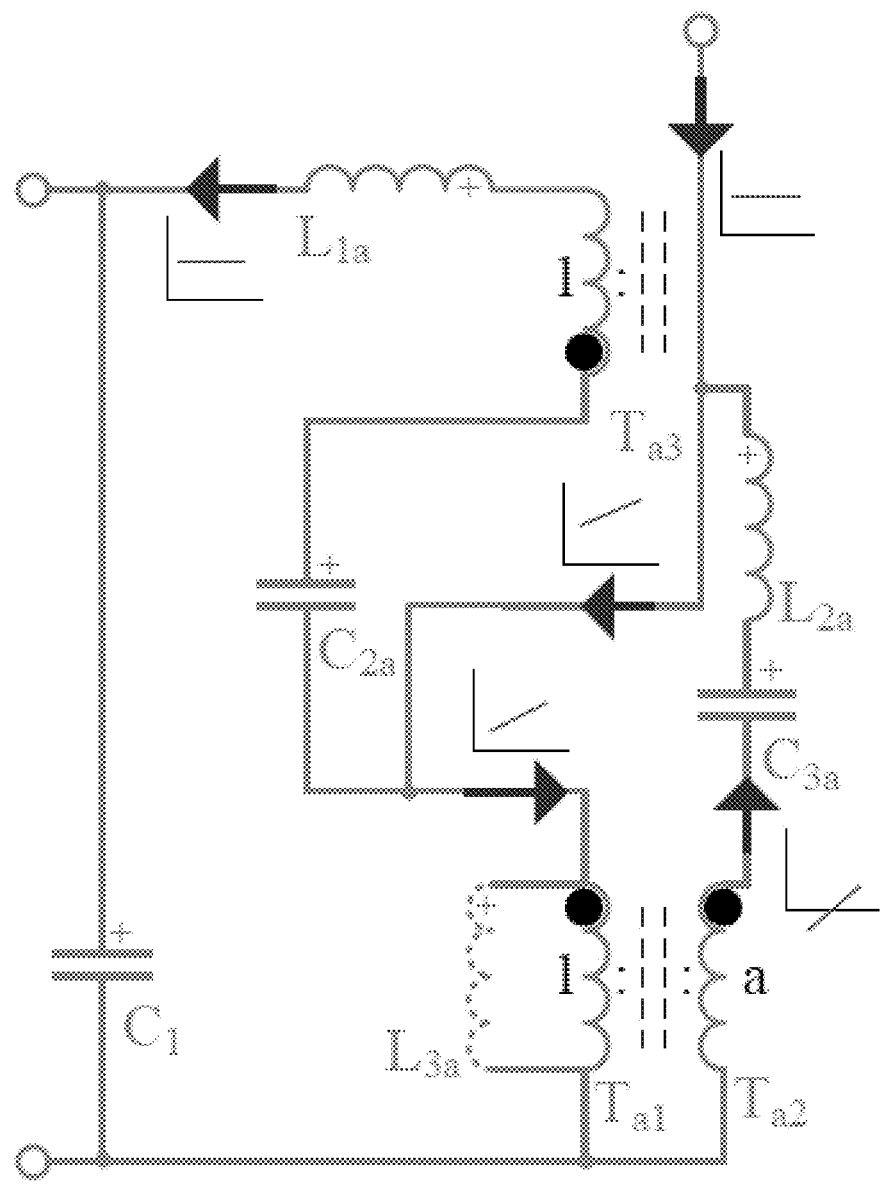
FIGS. 4A and 4B illustrate schematics of switching modes A and B, respectively, of a converter according to the embodiments of FIGS. 1-3 with the phase current flowing into the converter.
Figure 4B:
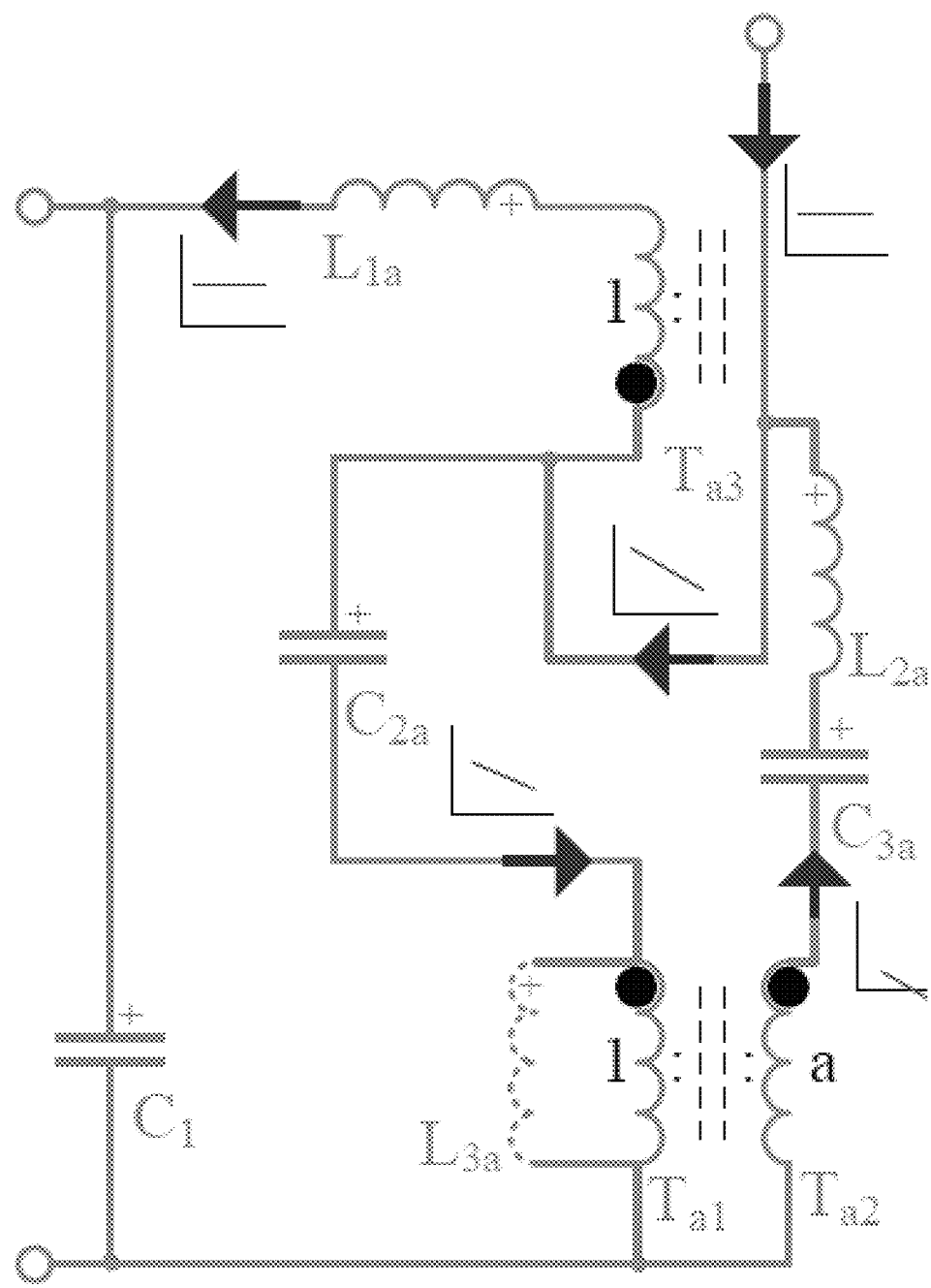

To study the behavior of the ZFR converter, the two modes of operation for the phase a of this converter are illustrated in FIGS. 4A and 4B. Benefits of a ZFR converter vanish during discontinuous conduction modes and, hence, such conditions are not described here.

In mode boost A as shown in FIG. 4A, switching transistor $Q_1$ is active and power flows from the output to charge the magnetizing inductor of $L_{3a}$. During this mode, magnetizing current of $L_{3a}$ is increasing. To compensate for the rise in the input current, the coupling of transformers $T_{a1}$:$T_{a2}$ is utilized to sample the voltage of magnetizing inductor $L_{3a}$ and create a voltage of $av_{L3a}$ across transformer $T_{a2}$.

In the steady state operation of the converter, the output ripple canceling capacitor $C_{3a}$ is charged to the momentarily phase a voltage (i.e., $v_a(t)=v_{C3a}(t)$). To achieve this, a sufficiently small value of output ripple canceling capacitor $C_{3a}$ is required. On the other hand, if output ripple canceling capacitor $C_{3a}$ is too small, it will not maintain a fixed voltage during one switching cycle. Selection of output ripple canceling capacitor $C_{3a}$ depends on the output ac voltage, rated power as well as the switching frequency. To design a 1 kW ZFR leg, a suitable capacitor value is 3.9 µF.

Considering a fixed voltage for output ripple canceling capacitor $C_{3a}$ during one switching period, the induced voltage by the transformer directly results in a current rise within transformer $T_{a2}$ as $L_{2a} di_{L2a}/dt = v_a - av_a - v_{C3a} \approx -av_a$. Comparing this equation with $L_{3a} di_{L3a}/dt = v_a$ and $i_{Ta1} = -ai_{L2a}$, it can be derived that if $L_{2,} = a(1-a)L_{3a}$, the rise in the current of magnetizing inductor $L_{3a}$ is canceled by the ripple of output ripple canceling inductor $L_{2a}$. Hence, the effective input ripple is almost zero (validity of these equations is with the assumption that $dv_{C3a}/dt \approx 0$). Based on this equation, there is a limit in selection of a as $0 < a < 1$. In practice, $a=0.25$ is a good performing selection. Higher values of a result in a larger voltage on output ripple canceling inductor $L_{2a}$ and demands a larger inductor. Selection of magnetizing inductor $L_{3a}$ is achieved by setting a maximum ripple limit on $i_{L3a}$. This limit defines the range of continuous conduction mode for the ZFR inverter of the present disclosure.

On the dc side, floating-dc-link capacitor $C_2$, is being discharged into the dc bus capacitor $C_1$ at a constant rate of $i_{dc}=i_{L1a}$. In the steady state operation of the converter, floating-dc-link capacitor $C_{2a}$ has the same voltage as the dc bus capacitor $C_1$. Hence, when the switching transistor $Q_1$ is active, variations of the current of filtering inductor $L_{1a}$ is defined by $L_{1a}di_{L1a}/dt=v_a+v_{C2a}-v_{Ta3}-v_{dc}$. The transformer ratio of 1:1 between transformers $T_{a3}$ and $T_{a1}$ induces the input voltage to transformer $T_{a3}$, which cancels the effect of the input voltage. Also, $v_{c2a} \approx v_{dc}$ by neglecting the ripples on the floating-dc-link capacitor $C_{2a}$. To achieve this, 10 µF is a suitable capacitor value for the floating-dc-link capacitor. Therefore, the current of filtering inductor $L_{1a}$ is almost constant. Hence, by properly designing the converter with respect to the switching period, the claim of almost zero ripple is valid. In conclusion, the larger floating-dc-link capacitors $C_{2x}$ and output ripple canceling capacitors $C_{3x}$ are selected, a better zero ripple behavior is achieved but at a higher cost of manufacturing and larger size requirements.

In the second mode of operation, switching transistor $Q_2$ is active, as illustrated in FIG. 4B. In this mode, $v_{L3a}=v_a-v_{C2a}<0$. This discharges the ripple induced in the magnetizing inductor during the first mode. The equations proving the almost zero ripples are still valid and hence, the converter operates with a negligible input or output current ripples.

Figure 5A:
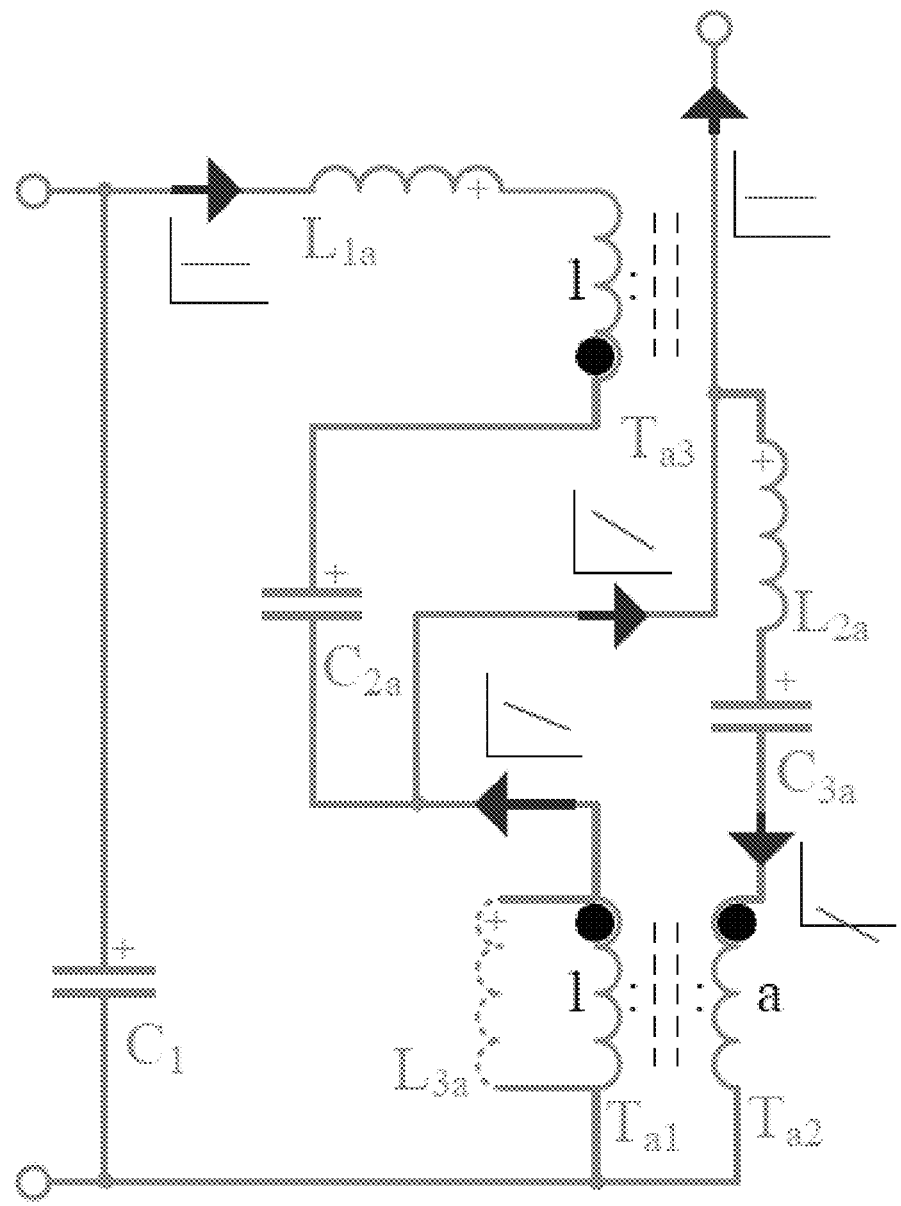
FIGS. 5A and 5B illustrate schematics of switching modes A and B, respectively, of a converter according to the embodiments of FIGS. 1-3 with the phase current flowing out of the converter.
Figure 5B:
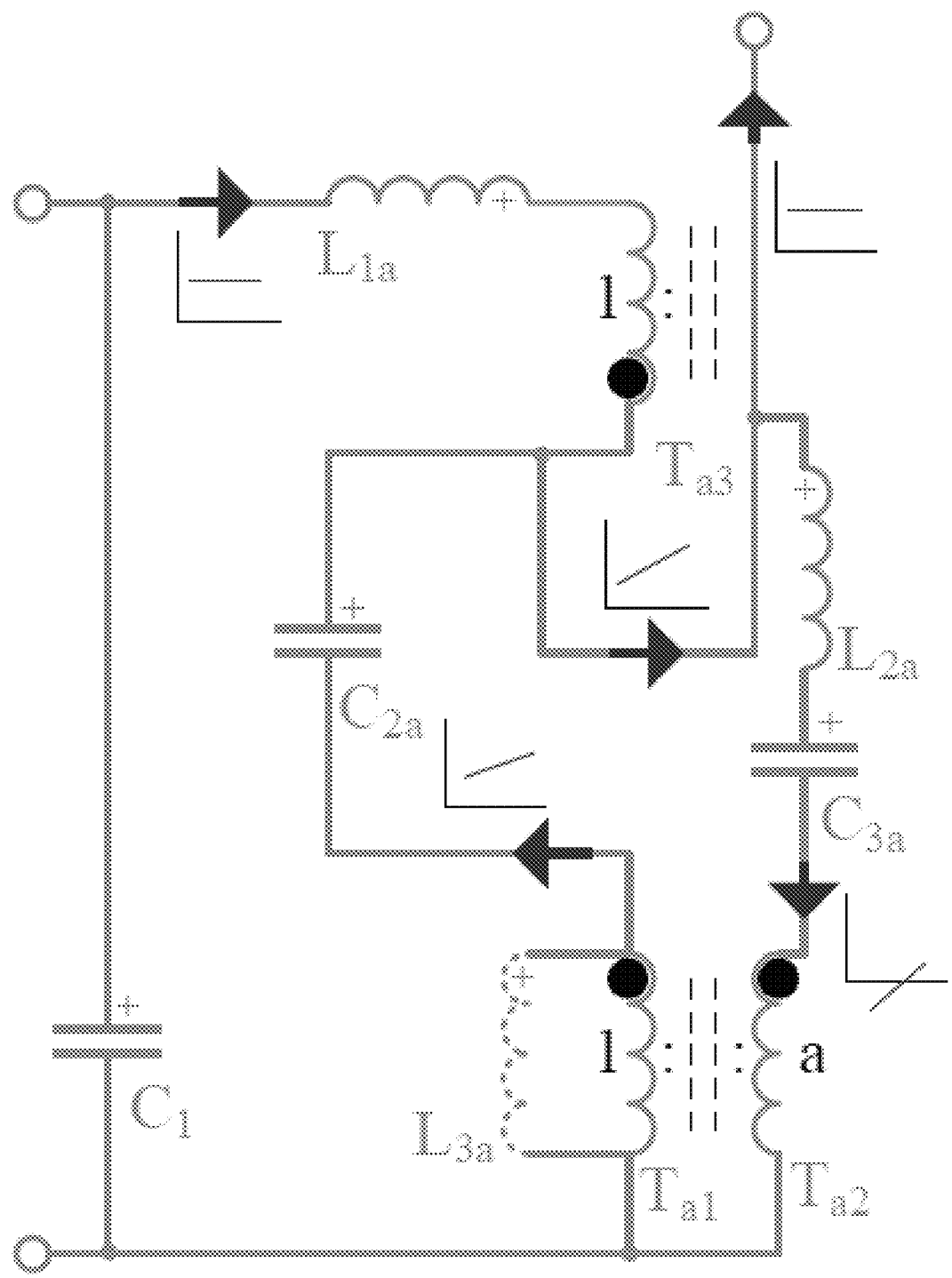

FIGS. 4A and 4B illustrate the operation modes of the ZFR inverter leg in a boosting current pattern (i.e., current flowing from phase a to the ZFR inverter leg). The bucking mode where the current flows from the dc bus to phase a has a similar analysis. The two modes for the buck ZFR inverter leg are illustrated in FIGS. 5A and 5B.

Modeling

First, the average model of one inverter leg is derived for a fixed duty cycle of $d_a=(1-d'_a)$ where $d_a$ is the duty cycle of switching transistor $Q_2$. Assuming that dc bus capacitor $C_1$ is a voltage source (i.e., $v_{C1a}=v_{dc}$), we have:

$$C_{2a}\dot{v}_{C_{2a}} = d_a i_{L_{1a}} - d_a i_{T_{a1}} + d_a i_{L_{3a}} \quad (1a)$$

$$C_{3a}\dot{v}_{C_{3a}} = i_{L_{1a}} \quad (1b)$$

$$C_{4a}\dot{v}_{C_{4a}} = i_{T_{a1}} - (i_{L_{1a}} + i_{L_{2a}} + i_{L_{3a}}) - i_a \quad (1c)$$

$$L_{1a}\dot{i}_{L_{1a}} = v_{C_{2a}} - v_{dc} \quad (1d)$$

$$L_{2a}\dot{i}_{L_{2a}} = (1-a)v_{C_{4a}} - v_{C_{3a}} - ad_a v_{C_{2a}} \quad (1e)$$

$$L_{3a}\dot{i}_{L_{3a}} = v_{C_{4a}} - d_a v_{C_{2a}} \quad (1f)$$

where $i_a$ is the inward phase current. If the transformer was ideal, $i_{Ta1}$ would be equal to $i_{L1a}+ai_{L2a}$. However, a practical transformer depends on the variations of flux, $d\varphi/dt$, which is zero for dc frequencies. Therefore, no practical transformer can have a coupling of 1:1 for dc frequencies. Hence, the ZFR inverter described herein implements a practical transformer as a dynamical system with a transfer function of $s/(s+2\pi f_p)$ where $f_p$ defines the pass band of the transformer. In this manner, a zero is introduced at the dc frequency and a pole at $s=-2\pi f_p$ to cancel this zero for higher frequencies. This approach models a practical transformer that does not pass any dc signals but can pass ac signals with a gain 1 (assuming that the frequency of interest, f, is far higher than the location of the pole $10f_p \leq f$). To achieve this, a dummy state variable of $i_{Ta1}$ is introduced as:

$$\begin{aligned}\dot{i}_{T_{a1}} = &-2\pi f_p i_{T_{a1}} + (v_{C_{2a}} - v_{dc})/L_{1a} + a \\ & ((1-a)v_{C_{4a}} - v_{C_{3a}} + ad_a v_{C_{2a}})/L_{2a}\end{aligned} \quad (2)$$

which can emulate the behavior of a practical transformer. Using this model, the dc components of the average model of the system for a duty cycle of da can be calculated as:

$$v_{C_{2a}} = v_{dc} \quad (3a)$$

$$v_{C_{3a}} = d_a v_{dc} \quad (3b)$$

$$v_{C_{4a}} = d_a v_{dc} \quad (3c)$$

$$i_{L_{1a}} = i_a \quad (3d)$$

$$i_{L_{2a}} = 0 \quad (3e)$$

$$i_{L_{3a}} = i_a(1-d_a)/(d_a) \quad (3f)$$

which suggests that the converter should not get close to $d_a=0$. In the normal sinusoidal applications where $d_a=0.5+\kappa \cos(\omega t)$, there should be no problems as long as $\kappa<0.5$. However, if one is interested in using zero vectors to get additional benefits such as 33% reduction in the switching losses by maintaining one phase in on or off states for one third of each cycle, then large magnetizing currents will be observed in magnetizing inductor $L_{1a}$. Hence, those methods should not be applied for a ZFR converter. A ZFR converter has to maintain $d_a>0$.

Based on this model, the ZFR converter described herein acts similar to a standard inverter leg. Hence, $v_a/v_{dc}=d_a$. Therefore, as long as $d_a>0$, all of the existing Pulse Width Modulation (PWM) methods available for traditional inverters can be applied to the ZFR inverter described herein.

The Class of Zero First-Order Ripple Converters

In this section, a class of damped bi-directional Zero First-order Ripple (ZFR) converters is described and modeled for both buck and boost modes of operation.

ZFR Converters: A Class of Nearly Zero Ripple Converters

Figure 6A:
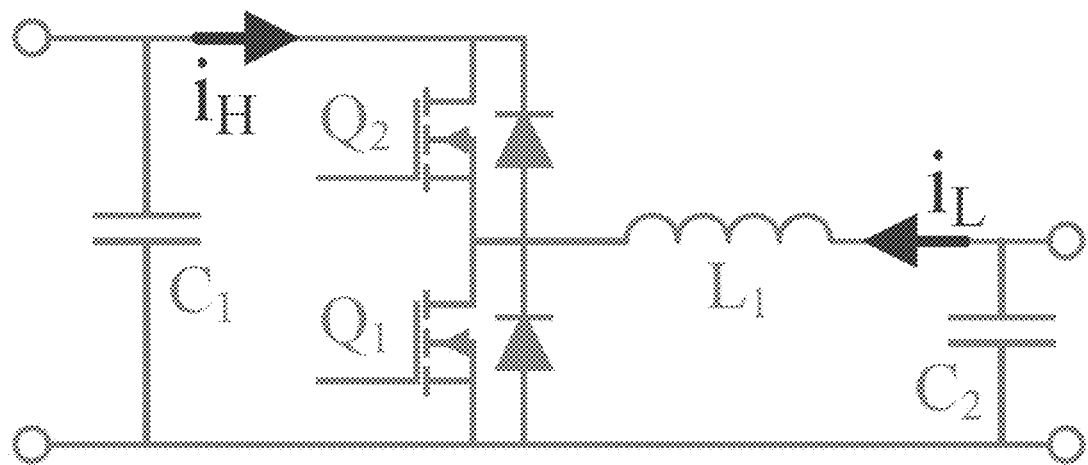
FIG. 6A illustrates a schematic of a bi-directional converter leg of a basic switching converter according to an embodiment.

FIG. 6A illustrates the widely used converter leg which can operate as a buck or a boost converter to manage the flow of power between a high voltage side of dc bus capacitor $C_1$ and a low voltage side of a floating-dc-link capacitor $C_2$. This converter is efficient, small, modular, and has a low cost of manufacturing. However, the most significant drawback of this converter is the requirement for large input and output filtering capacitors. In this converter, $i_H$ is a train of pulses and $i_L$ has triangular ripples. Both of these currents induce voltage ripples on the output and input capacitors, respectively. Traditionally, this issue was resolved by simply selecting large capacitors for dc bus capacitor $C_1$ and floating-dc-link capacitor $C_2$. However, this solution increases the weight, cost, and volume of the converter.

For this reason, the class of ZFR converters described herein is incorporated to eliminate the requirements for large filtering capacitors. In the first step, the placement of filtering inductor $L_1$ is changed from its placement in conventional approaches. This filtering inductor, which is the main energy storage element in a switching converter, is located in series with the switching unit as is denoted as magnetizing inductor $L_3$ in FIG. 6B. Then a coupled inductor (e.g., $T_a$:$T_b$:$T_c$) is introduced to compensate for the switching ripples as described in the following.

It should be noted that magnetizing inductor $L_3$ is in fact not a separate inductor and is the internal magnetizing inductor of the transformer. Hence, similar to a flyback converter, the design of the transformer is such that the core provides sufficient energy storage capability (e.g., by addition of an air gap). Also, the duty cycle of switching transistor $Q_2$ is d and the duty cycle of switching transistor $Q_1$ is d'=1−d. The switching period is $T_{sw}$=1/$f_{sw}$.

Figure 7A:
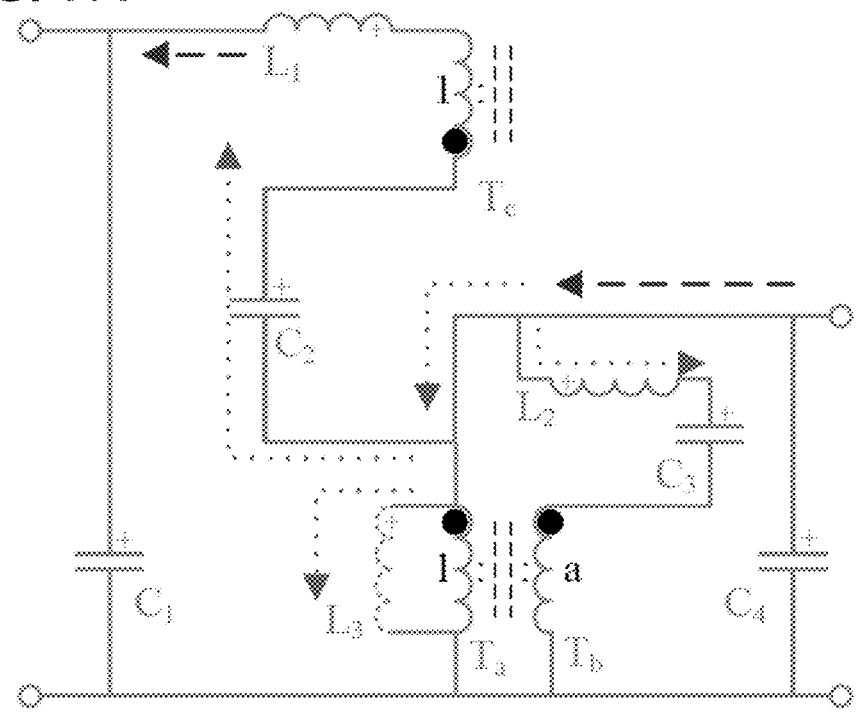
FIGS. 7A and 7B illustrate schematics of switching modes A and B, respectively, of a ZFR converter according to the embodiments of FIGS. 6A and 6B.
Figure 7B:
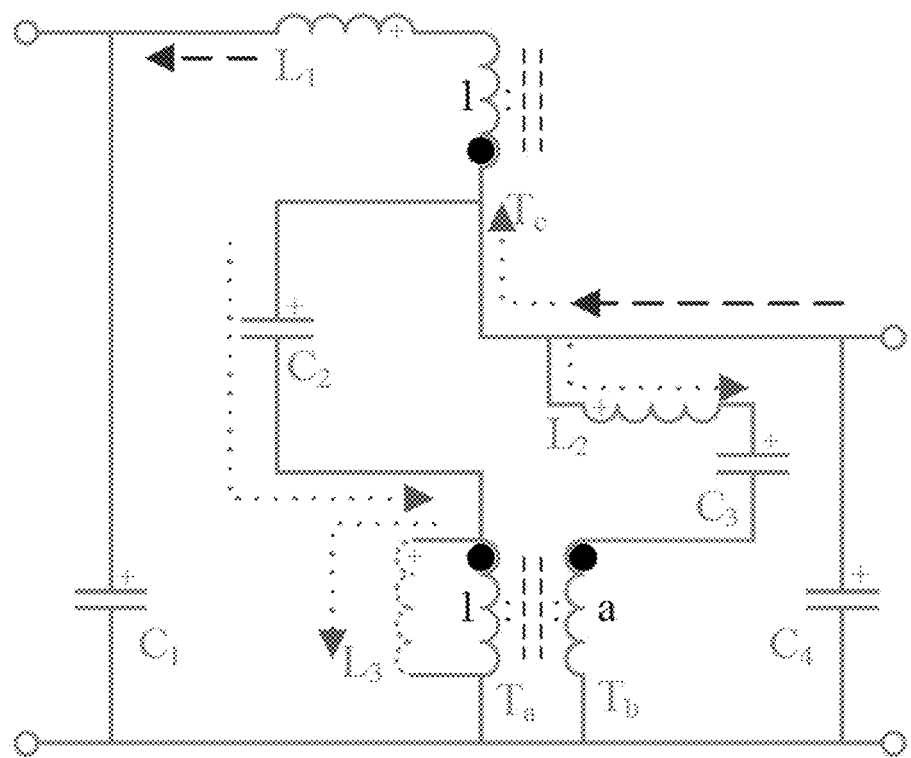

The two modes of operation for this ZFR converter are illustrated in FIGS. 7A and 7B. These modes are developed with the assumption of Continuous Conduction Mode (CCM) with respect to magnetizing inductor $L_3$. It should be noted that some benefits of this converter are lost for the case of Discontinuous Conduction Mode (DCM) and hence, DCM is not described herein.

Modes of Operation and Design Requirements

When switching transistor $Q_1$ is active, magnetizing inductor $L_3$ is connected to the input (i.e., high-frequency ripple filter capacitor $C_4$) as shown in FIG. 7A. Hence, a rise in the current of this magnetizing inductor is observed such that $L_3 di_{L3}/dt=v_{in}$. To compensate for this current rise, a transformer is utilized to sample the voltage of magnetizing inductor $L_3$ and create a voltage equal to $-av_{in}$ across the output ripple canceling inductor $L_2$. During the steady state operation of the converter, the voltage of output ripple canceling capacitor $C_3$ is equal to the input voltage (i.e., $v_{C4}=v_{C3}=v_{in}$). As a result, variations in the current of output ripple canceling inductor $L_2$ follows $L_2 di_{L2}/dt=v_{in}-v_{C3}-av_{in}\approx -av_{in}$ (assuming that the changes in the voltage of output ripple canceling capacitor $C_3$ are negligible). This current variation goes through the transformer $T_a$:$T_b$ and appears as $di_{Ta}/dt=-adi_{Tb}/dt=a^2 v_{in}$ on the primary side. Now, one can notice that $i_{in}=i_{L2}+i_{Ta}+i_{L3}+i_{L1}$ with its derivative as $di_{in}/dt=(1/L_3-a/L_2+a^2/L_2)v_{in}$ assuming that $di_{L1}/dt\approx 0$ as will be shown later. By setting $di_{in}/dt=0$, one will achieve the fundamental requirement of this topology as $L_2=a(1-a)L_3$.

This relation ensures the cancellation of the first-order derivative of the input current. In a practical implementation, the assumption of $v_{C3}=v_{in}$ cannot be guaranteed. In fact, $C_3 dv_{C3}/dt=i_{L2}$. Hence, $$\frac{L_2 di_{L2}}{dt}\bigg|_0^{d'T_{sw}} = -av_{in} - \int_0^{d'T_{sw}} i_{L2}/C_3 \quad (4)$$

and the variations of the current follows a second order differential equation. As a result, only the first order ripples of the input current are canceled. The above second order variations are negligible for a properly designed converter. Additionally, $i_{L2}$ has a zero dc value. Hence, during each period, the above integral is calculated over a signal that is crossing zero which helps to keep the integral negligible. Since only the first derivative is zero, this converter is called a Zero First-order Ripple or Zero Fundamental Ripple (ZFR) converter.

On the output side, floating-dc-link capacitor $C_2$ is being discharged into the output capacitor (i.e., dc bus capacitor) $C_1$ at a constant rate of $i_{out}=i_{L1}$. In the steady state operation of the converter, floating-dc-link capacitor $C_2$ has the same voltage as the output capacitor. Hence, when the switching transistor $Q_1$ is active, variations of the current of filtering inductor $L_1$ is defined by $L_1 di_{L1}/dt=v_{in}+v_{C2}-v_{Tc}-v_{out}$. The transformer ratio of 1:1 between transformers $T_a$ and $T_c$ induces the input voltage (i.e., $v_{Ta}=v_{in}$) on transformer $T_c$.

Also, during the steady state operation, $v_{C2}\approx v_{out}$ by neglecting the ripples on floating-dc-link capacitor $C_2$. Therefore, the current of filtering inductor $L_1$ is almost constant considering the fact that $L_1 di_{L1}/dt=v_{in}+v_{C2}-v_{Tc}-v_{out}\approx 0$. Similar to output ripple canceling inductor $L_2$, the accurate current of filtering inductor $L_1$ follows $$\frac{L_1 di_{L1}}{dt}\bigg|_0^{d'T_{sw}} = -\int i_{L1}/C_2,$$

which is a second order differential equation with the first order variations of zero in the vicinity of t=0. Hence, by properly designing the converter with respect to the switching period, the claim of almost zero ripples is valid. In conclusion, the larger floating-dc-link capacitor $C_2$ and output ripple canceling capacitor $C_3$ are selected, the better zero ripple behavior is achieved. But this is gained at a higher cost of manufacturing and larger size requirements.

Figure 8:
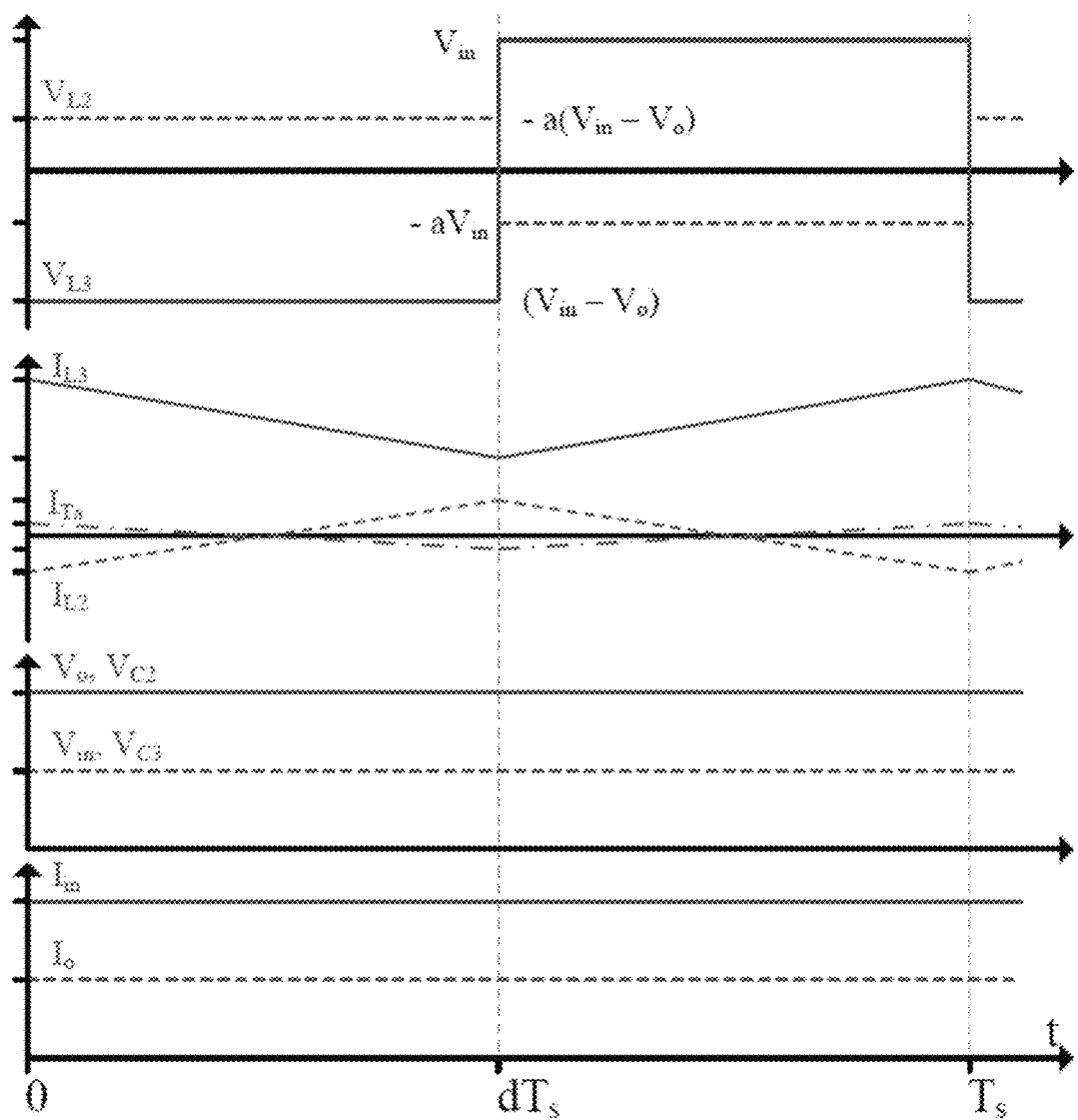
FIG. 8 illustrates waveforms of the bi-directional converter leg during the switching modes shown in FIGS. 7A and 7B.

In the second mode of operation, switching transistor $Q_2$ is active as is illustrated in FIG. 7B. In this mode $v_{L3}=v_{in}-v_{C2}\leq 0$. This will discharge the magnetizing ramp induced by the first mode. The equations proving the almost zero ripples are still valid and hence, the converter will operate with a negligible input or output current ripples. Voltage and current waveforms of the ZFR leg are shown in FIG. 8. The waveforms of this figure are valid under the assumption that the variations in voltages of floating-dc-link capacitor $C_2$ and output ripple canceling capacitor $C_3$ are negligible. In such conditions, the sum of $i_{L2}+i_{L3}+i_{Ta}$ is a dc value and is equal to $i_{in}-i_{L1}$. Now that the fundamental requirement for achieving the almost zero behavior was described, a complete model of the converter is derived in the following section.

Damping Resistors and Average Model

Figure 6B:
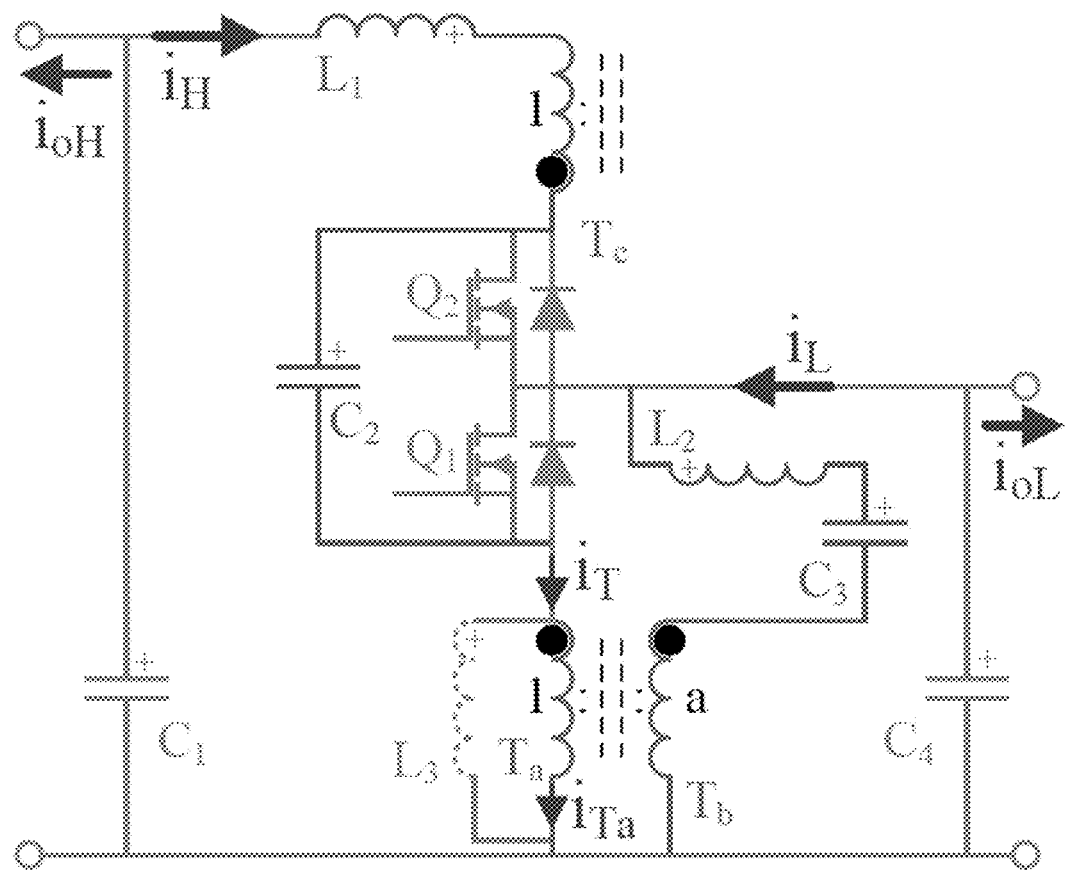
FIG. 6B illustrates a schematic of a bi-directional converter leg of a super switching converter with ripple cancellation mechanisms that form a ZFR converter according to an embodiment.

The converter shown in FIG. 6B suffers from low damping factors on the poles generated by $L_2$–$C_3$ and $L_3$–$L_1$–$C_2$ resonant tanks. In practice, one can utilize active damping methods to actively oppose the oscillations occurring on these tanks. However, if the tank frequencies are close to the switching frequency, this approach is not effective. A better approach is to add damper resistors to reduce the quality factor of these tanks. However, bypass paths should be considered for the switching harmonics to eliminate loss of power in these added resistors. A common approach to design a damped capacitor bank is through the utilization of a smaller capacitor with low Equivalent Series Resistor (ESR) in parallel with a larger capacitor in series with a resistor. This approach is known as C-RC tanks.

Figure 9:
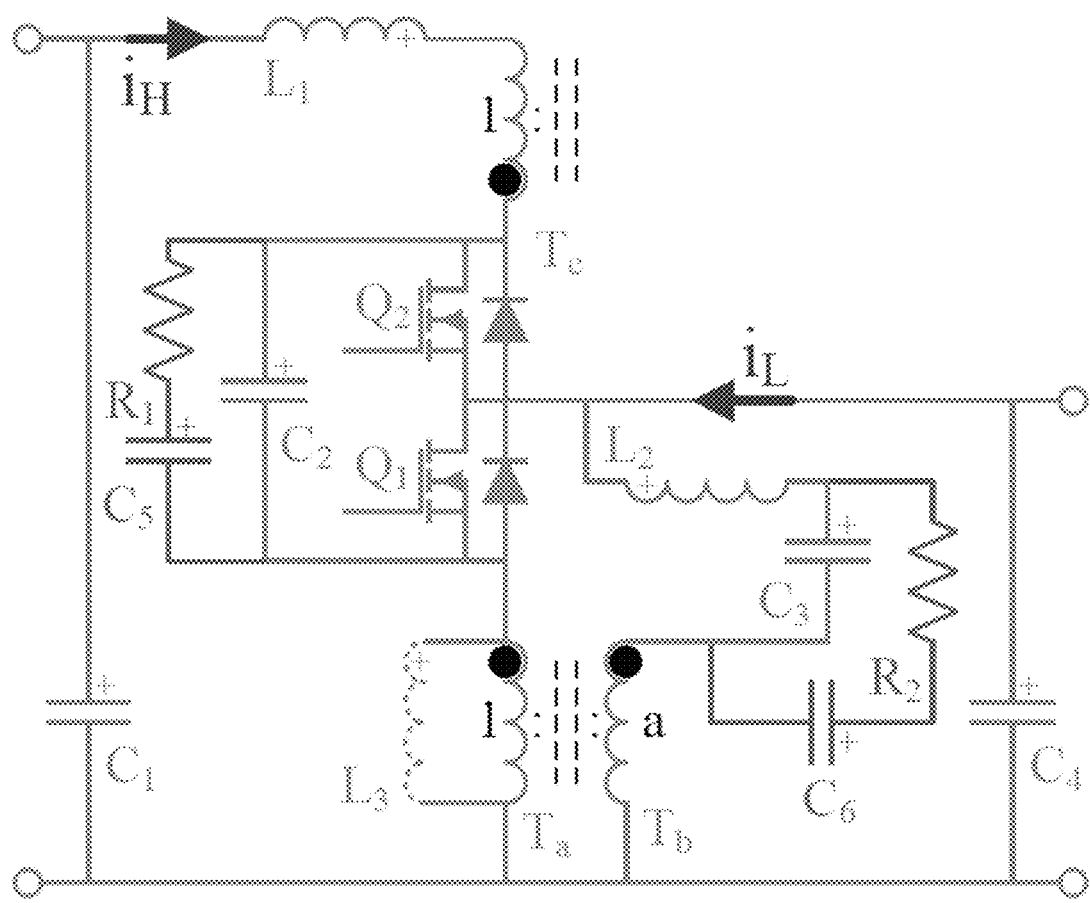
FIG. 9 illustrates a schematic of a ZFR converter including damping resistors according to an embodiment.

The series RC path will add a zero and a pole to the original transfer function. For instance, a series LC has a current to voltage transfer function of $i_{LC}/v_{LC}=Cs/(1+LCs^2)$. But if the capacitor is broken into a smaller capacitor $C_1$ and a larger capacitor $C_2$ in series with a resistor R, the response is $i_{LC}/v_{LC}=((C_1+C_2)s+C_1C_2Rs^2)/(1+RC_2s+L(C_1+C_2)s^2+L(C_1C_2Rs^3)$ which can be effectively damped using R without any significant resistance for frequencies higher than that of $1/\sqrt{L(C_1+C_2)}$. Therefore, the addition of the two damping circuits is included as shown in FIG. 9. One can design an equivalent damping circuit using an inductive circuit assuming that the tank frequency is higher than the switching frequency, but that approach is more costly. Here, the selection criteria for the capacitors is to set all of the tank frequencies to a lower frequency than that of the switching frequency as described later in the design procedure.

To design the damping circuits, the average model of the power converter shown in FIG. 9 is derived as (assuming that the duty cycle, d, is fixed):

$$L_1 \dot{i}_{L_1} = v_{C_2} - v_{C_1} \tag{5a}$$

$$L_2 \dot{i}_{L_2} = (1-a)v_{C_4} - v_{C_3} + dav_{C_2} \tag{5b}$$

$$L_3 \dot{i}_{L_3} = v_{C_4} - dv_{C_2} \tag{5c}$$

$$C_2 \dot{v}_{C_2} = -d'i_{L_1} - di_{T_a} + (v_{C_5} - v_{C_2})/R_1 + di_{L_3} \tag{5d}$$

$$C_3 \dot{v}_{C_3} = i_{L_2} + (v_{C_6} - v_{C_2})/R_2 \tag{5e}$$

$$C_5 \dot{v}_{C_5} = (v_{C_2} - v_{C_0})/R_1 \tag{5f}$$

$$C_6 \dot{v}_{C_0} = (v_{C_2} - v_{C_6})/R_2 \tag{5g}$$

where df (t)/dt is denoted using $\dot{f}(t)$. If the transformer was ideal, $i_{T_a}$ would be equal to $i_{L_1} + a i_{L_2}$. However, a technical problem is that $i_{L_1}$ has a dc component which will not pass through a practical transformer. Hence, a practical transformer is implemented as a dynamical system with a transfer function of $s/(s+2\pi b)$ where b defines the pass band of the transformer.

This transformer introduces a zero on the dc frequency to eliminate any transfer of a dc signal while the pole at $s=2\pi b$ cancels this effect at higher frequency. Hence, a high pass system is derived with no gain for dc frequencies and a gain of one for higher frequencies (i.e., $10b \leq f$). The pole location b depends on the transformer design parameters. But for simplicity, one can assume that $0.01 f_{sw} \leq b \leq 0.2 f_{sw}$ as the design of the transformer is for $f_{sw}$. The core area and the number of turns do not allow for a pass band lower than that of the design parameters (i.e., the magnetizing impedance acts like a short circuit for lower frequencies). To achieve this, a dummy state variable of $i_{T_a}$ is introduced as:

$$i_{T_a} = -2\pi b i_{T_a} + s(i_{L_1}/L_1 + a i_{L_2}/L_2) \tag{6}$$
$$= -2\pi b i_{T_a} + (v_{C_2} - v_{C_1})/L_1 + a((1-a)v_{C_4} - v_{C_3} + dav_{C_2})/L_2$$

which can emulate the behavior of a practical transformer.

Depending on the mode of operation, the converter regulates the voltage of the high side or the voltage of the low side (i.e., dc bus capacitor $C_1$ is the input side and high-frequency ripple filter capacitor $C_4$ is the output or reverse). In either case, the input is considered as a voltage source and hence no equation is included for the corresponding capacitor. The output has dynamics described by only one of the following equations depending on the operation mode:

$$\begin{cases} C_1 \dot{v}_{C_1} = i_{L_1} - i_{o_n} \\ C_4 \dot{v}_{C_4} = i_{T_a} - i_{L_1} - i_{L_2} - i_{L_3} - i_{o_L} \end{cases} \tag{7}$$

To perform stability analysis and to optimally select the damper parameters, the small signal model of the converter is of interest. To derive a small signal model, the converter is considered to be connected to a voltage source on the low voltage side which will eliminate the capacitor voltage equation for high-frequency ripple filter capacitor $C_4$. Hence, it is assumed that the converter is operating as a boost regulator. However, based on the above equation, one can derive the following process for a buck regulator. By defining a vector of state variables $x=[i_{L1}, i_{L2}, i_{L3}, v_{C1}, v_{C2}, v_{C3}, v_{C5}, v_{C6}, i_{T_a}]^T$ the small signal model can be derived as $x = \bar{x} + \tilde{x}$ where $\bar{x}$ is vector of the state variables at the equilibrium condition and $\tilde{x}$ is the vector of small signal variations of the state variables.

Using this large signal model, the steady state value of each state variable is calculated for a fixed duty cycle of $\bar{d}$ as:

$$\bar{x} = [v_{in}/(\bar{d}R_o), 0, v_{in}(1-\bar{d})/(\bar{d}^2 R_o), v_{in}/\bar{d}, v_{in}/\bar{d}, v_{in}, v_{in}/\bar{d}, v_{in}, 0] \tag{8}$$

which can demonstrate the steady state gain of the converter as $\bar{v}_{out}/v_{in} = 1/\bar{d} = 1/(1-\bar{d}'')$ which is similar to a standard boost converter.

The small signal model of the converter near the above equilibrium point can be derived as $\dot{\tilde{x}} = A\tilde{x} + B\tilde{u}$ where $$A = \begin{bmatrix} 0_{3\times3} & A_{LC} & 0_{3\times2} & 0_{2\times1} \\ A_{CL} & A_{CC} & A_{CC_d} & A_{CT_o} \\ 0_{2\times3} & A_{C_dC} & A_{C_dC_d} & 0_{2\times1} \\ 0_{1\times3} & A_{T_aC} & 0_{1\times2} & -2\pi b \end{bmatrix} \tag{9a}$$

$$A_{LC} = \begin{bmatrix} -1/L_1 & 1/L_1 & 0 \\ 0 & a\bar{d}/L_2 & -1/L_2 \\ 0 & -\bar{d}/L_3 & 0 \end{bmatrix} \tag{9b}$$

$$A_{CL} = \begin{bmatrix} 1/C_1 & 0 & 0 \\ -d'/C_2 & 0 & \bar{d}/C_2 \\ 0 & 1/C_3 & 0 \end{bmatrix} \tag{9c}$$

$$A_{CC} = -\begin{bmatrix} 1/(C_1 R_0) & 0 & 0 \\ 0 & 1/(C_2 R_1) & 0 \\ 0 & 0 & 1/(C_3 R_2) \end{bmatrix} \tag{9d}$$

$$A_{CC_d} = \begin{bmatrix} 0 & 0 \\ 1/(C_2 R_1) & 0 \\ 0 & 1/(C_3 R_2) \end{bmatrix} \tag{9e}$$

$$A_{CT_o} = \begin{bmatrix} 0 \\ -\bar{d}/C_2 \\ 0 \end{bmatrix} \tag{9f}$$

$$A_{C_dC} = \begin{bmatrix} 0 & 1/(C_5 R_1) & 0 \\ 0 & 0 & 1/(C_6 R_2) \end{bmatrix} \tag{9g}$$

$$A_{C_dC_d} = \begin{bmatrix} -1/(C_5 R_1) & 0 \\ 0 & -1/(C_6 R_2) \end{bmatrix} \tag{9h}$$

$$A_{T_aC} = \begin{bmatrix} -1/L_1 & (1/L_1 + a^2\bar{d}/L_2) & -a/L_2 \end{bmatrix} \tag{9i}$$

where $R_o$ is the output resistor connected to the high voltage side (i.e., $C_1$). 0 is a matrix of zeros with an appropriate size. $\bar{d}' = 1 - \bar{d}$ is the steady state duty cycle of the $Q_1$. The vector of inputs $\tilde{u} = [\tilde{v}_{in}, d]^T$ is:

$$B = \begin{bmatrix} 0 & 0 \\ (1-a)/L_2 & a\bar{v}_{C_9}/L_2 \\ 1/L_3 & -\bar{v}_{C_2}/L_3 \\ 0 & 0 \\ 0 & (i_{L_2} + i_{L_1} - i_{T_a})/C_2 \\ 0 & 0 \\ 0 & 0 \\ 0 & 0 \\ a(1-a)/L_2 & a^2\bar{v}_{C_3}/L_2 \end{bmatrix} \quad (10)$$

Using this model, an optimization framework for designing the damping capacitors is introduced as follows. From FIG. 9, one can notice that if the damping resistors go towards infinity, the damping circuits are disconnected. Similarly, if the damping resistors go towards zero, both capacitors are added together to form a larger capacitor and hence, the damping circuitry will vanish. Hence, there is an optimal value for the damping resistors to maximize the damping performance. To start, the ratio between the capacitors are defined as $k_1 = C_5/C_2 > 1$ as well as $k_2 = C_6/C_3 > 1$. C2 and $C_3$ are selected based on other criteria which are introduced in the next section. However, $k_1$ and $k_2$ are parameters that have to be optimally selected using the proposed framework. To optimally select the set of $D = \{R_1, R_2, k_1, k_2\}$, one needs to perform a multi-objective optimization over the feasible range of these parameters. In an embodiment, the optimization is:

$$\max_{\mathcal{D}} O_1 + \gamma_1 O_2 + \gamma_2 O_3 \quad (11a)$$

$$\text{s.t.} \quad v = [v_i] = [\lambda | \, |A(\mathcal{D}) - \lambda I| = 0] \quad (11b)$$

$$1 \leq k_1, k_2 \quad (11c)$$

$$O_1 = -\max(\Re(v)) \quad (11d)$$

$$O_2 = \min(-\text{diag}(|v|)^{-1}\Re(v)) \quad (11e)$$

$$O_3 = -(k_1 + k_2) \quad (11f)$$

where $\Re(\bullet)$ is the vector of the real parts of its argument and diag($\bullet$) generates a diagonal matrix from its input vector. v is the vector of eigenvalues $\lambda_i$ which is defined using 11b.

It should be noted that the matrix A in (9) is a function of D and has to be dynamically recalculated during the optimization to be used as the constraint 11b. $\gamma_1$ and $\gamma_2$ form a linear combination between the objectives. $O_1$ maximizes the absolute value of the real part of the slowest pole of the system to achieve a faster settling time. $O_2$ maximizes the lowest damping factor of the poles ($O_2$ will find the lowest damping factor, and the optimization will then maximize the lowest damping factor). By maximizing the lowest damping factor, the circuit will be damped as much as possible to minimize the oscillations caused by the complex pole pairs. A simple definition for the damping factor can be proposes as:

$$\zeta = -\Re(\lambda)/|\lambda| \quad (12)$$

which defines the damping factor as the ratio between the real part of the pole and its absolute value. If the pole is imaginary, this value is zero and if the pole is real, this value is one. So by maximizing this parameter, one can reduce the impacts of the sinusoidal terms (i.e., imaginary components) in the time domain response of the pole. Lastly, the third objective minimizes the sum of $k_1$ and $k_2$. The larger this sum is, the larger capacitors are required. Hence, the third objective aims at finding a compromise between the first two performance objectives and the cost of the converter.

Additionally, a constraint on the value of the resistors is required to reduce the passage of the switching currents through the resistors. If the resistors are too small, the main switching current will pass through the series RC paths and will reduce the efficiency of the converter. Consider the block $C_3$–$C_6$–$R_2$. At the switching frequency, the impedance of $C_3$ is $|Z_{C_3}| = 1/(2\pi f_{sw}C_3)$ while the impedance of $C_6$–$R_2$ is $|Z_{C_6R_2}| = \sqrt{1 + 4\pi^2 f_{sw}^2 k_2^2 C_3^2 R_2^2}/(2\pi f_{sw}C_3)$. If $\kappa = |Z_{C_6R_2}|/|Z_{C_3}|$, then it is desired to have M times higher impedance for $C_6$–$R_2$ compared to the $C_3$ path at this frequency to ensure passage of the switching ripples from the $C_3$ path (i.e., $\kappa \geq M \geq 1$). Hence, a lower boundary for $R_2$ is derived as:

$$(\sqrt{M^2 k_2^2 - 1})/(2\pi f_{sw} k C_3) \leq R_2 \quad (13)$$

($M^2 k_2^2$ is always greater than one since both $k_2$ and M are greater than one). A similar boundary for $R_1$ is $(\sqrt{M^2 k_1^2 - 1})/(2\pi f_{sw} k C_2) \leq R_1$. Using these final constraints, the optimization can be solved to find the optimal values for the set D.

The above optimization problem is non-convex and is NP-hard (the values of $k_i$ and $R_i$ are not continuous and depend on the availability of the components). One can solve this optimization using a heuristic method such as the particle swarm optimization or differential evolution. It should be noted that this is a design optimization and does not have to be solved very often. Hence, improving the speed of the optimization is not necessary.

Design Procedure for a ZFR DC-DC Converter

In this section, the design procedure for a ZFR boost converter is introduced along with a design example of a 1 kW 50 V to 100 V ZFR boost converter operating at a switching frequency of 200 kHz. This section is introduced with respect to parameters defined in FIG. 9. Based on the model developed earlier, the steady state rating of each element is calculated.

Power Stage Design

The first step in designing a ZFR converter starts with the selection of a nominal current ripple on the magnetizing inductance of the transformer, $L_3$. This approach is similar to the design procedure for a boost or a fly back converter. In practice, a current ripple of 25% can lead to satisfactory results. Although the input current has no ripples, the magnetizing current of the transformer has ripples and these ripples define the CCM range for the converter. Using the up ramp in the current of the inductor, one can derive $$L_3 = v_{in} d' T_{sw}/(2k\bar{i}_{L_3}) \quad (14)$$

where k is the desired ratio between the amplitude of the current ripple to the nominal average current. For the 1 kW converter described herein, k=25% and hence, $L_3$ is 25 µH which is set to 28 µH (e.g., due to the quantization effect while wrapping the coil). This value is the magnetizing inductance of the transformer seen from $T_a$.

The next step is to design the input ripple canceling circuit. The ratio of the transformer for $T_a$:$T_c$ is 1:1. However, the selection of $T_a$:$T_b$ is a design choice. For the proper operation of the circuit, $L_2 = a(1-a)L_3$. Hence, $0 < a < 1$ is a boundary for selecting a. To optimally select a, one should note that the voltage applied $L_2$ is $av_{in}$ and hence, the current of this inductor is proportional to $a/L_2$. Also, the total energy stored in this inductor is proportional to $L_2 i_{L_2}^2$ and so to a2/$L_2$. However, $L_2$=a(1−a)$L_3$. So, the energy stored in this inductor which is directly responsible for the size and volume of this inductor is proportional to a/(1−a). As a result, this value should be minimized on the range of 0<a<1. $L_2$ is the sum of the leakage inductance of $T_b$ and an added inductance of $L'_2$. Hence, there is another minimum boundary induced by the leakage inductance of $T_b$ as $L_{l-T_b}$≤a(1−a)$L_3$ (i.e., the added inductance of $L'_2$ cannot be a negative value value). Therefore, the optimal value for a is the ratio between the leakage inductance of $L_{l-T_b}$ and the magnetizing inductance, $L_3$. However, to enforce the placement of the main magnetizing behavior on $T_a$, a small added inductance, $L'_2$, in series with $T_b$ is preferred. In an embodiment, a=0.25. Hence, for the 1 kW example described herein, $L_2$=$L_{l-T_b}$+$L'_2$=5.2 μH (in the practical example, the leakage inductance of $T_b$ is measured at 4.2 μH and hence, $L'_2$=1 μH).

The selection of output ripple canceling capacitor $C_3$ is a trade-off between the cost and the performance. Higher capacitance values will allow for better ripple cancellation but at a higher cost. The lowest value that can be selected is limited by the resonance frequency of L=−($C_3$−$C_6$). To have a good ripple cancellation, the voltage ripples of this capacitor are limited to a factor of k=1% to 10%. Voltage of this capacitor varies as a result of $i_{L2}$. Hence, assuming a linear ramp for the current of $L_2$, the current of $i_{L2}$ by the end of $d'T_{sw}$ is $i_{L2}$=a$v_{in}$$d'T_{sw}$/2$L_2$. The current of output ripple canceling inductor $L_2$ is roughly triangular. To get a simple model for the current of output ripple canceling capacitor $C_3$, it is assumed that the average of this current is passing through the capacitor (i.e., the triangle is represented by its dc average). Hence, as an approximation, to get k % ripple on $v_{C3}$, one can derive:

$$C_3 = ad'T_{sw}^2/(8L_2k) \quad (15)$$

and with k=2%, $C_3$≈4 μF. But to ensure stable operation of the converter and for proper selection of the damping resistors, the tank frequency of $C_3$−$L_2$ should be set to at least 0.5-2 decades below the switching frequency (otherwise, either the circuit is not properly damped or the efficiency is reduced as the main switching ripples will pass through the damping resistors).

In this example, $f_{L2C3}$≈25 kHz which is 0.85 decade below the switching frequency. Hence, output ripple canceling capacitor $C_3$ is increased to 8 μF to achieve the 1 decade separation. This approach will slightly increase the cost of the converter while improving its efficiency (this separation allows for proper design of the damping resistor and to prevent any switching ripples passing through the damping resistor). For a practical implementation, one needs a capacitor with the selected value and with a current tolerance of:

$$i_{C_3}^{RMS} = av_{in}d'T_{sw}/(2\sqrt{3}L_2).$$

In this example, this value is 2 A.

The next step is to select filtering inductor $L_1$. Filtering inductor $L_1$ is the total inductance of the leakage inductance of $T_c$ and an external inductor $L'_1$ as $L_1$=$L_{l-Tc}$+$L'_1$. This inductor prohibits variations of current on the $T_c$ side. Hence, by selecting a sufficiently large inductor, $L_1$ regulates the current of its path and prevents variations in the current of $T_c$. The minimum value for this inductance is the leakage inductance of $T_c$ itself. However, in a preferred embodiment a series inductance $L'_1$ is added so that the total inductance in this path is twice as large as magnetizing inductor $L_3$ to ensure that the magnetizing behavior appears on $T_a$. In the example described herein, an external inductor of $L'_1$=25 μH is added to the leakage inductance of $L_{l-T_c}$ which is measured at 28 μH.

The floating-dc-link capacitor $C_2$ is selected by assuming a nominal voltage ripple as well. The voltage ripple of this capacitor is almost canceled by the voltage induced on $T_c$ and will not directly propagate to the output (unlike conventional converters, in this converter the ripple is passed as a second order differential equation which relaxes the requirements for larger capacitance values). In this embodiment, a nominal ripple of k=2.5% is considered. Therefore, $$C_2 = d'T_{sw}/(kR_v) \quad (16)$$

and hence, $C_2$=10 μF for the example understudy.

After selection of this capacitor, the resonant tank frequency of $L_3$−$L_1$−$C_2$ is checked to ensure sufficient separation from the switching frequency. In this case, $f_{L_1L_3C_2}$≈5 kHz. For a practical implementation, one needs a capacitor with the selected capacitance and a current ripple tolerance of $i_{C_2}^{RMS}$≈$i_{out}$=$v_{in}$/(d$R_o$). In this example, this value is 10 A and hence, a high current, low ESR metalized polypropylene film capacitor will be selected.

The output capacitor does not have any specific requirements as the ripples on this capacitor are theoretically negligible. One can design this capacitor based on the full load step considering the bandwidth of the converter. If the converter has a full step response time of $T_{settle}$, then the output capacitor should tolerate the full load from the time of the load step t to t+$T_{settle}$ with a maximum drop of k %. Hence, $T_{settle}$/(k$R_o$)≤$C_1$. In this example, $C_1$=7.5 μF.

Lastly, to optimally find the damping parameters, the circuit parameters of $C_1$=7.5 μF, $C_2$=10 μF, $C_3$=8 μF, $L_1$=25 pH, $L_2$=5.2 pH, and $L_3$=28 μH are placed in (9) to derive the state matrix A. This matrix is a 9×9 matrix with 4 unknown parameters of $C_5$, $C_6$, $R_1$, and $R_2$. To perform the optimization (11), $C_5$=$k_1C_2$ and $C_6$=$k_2C_3$ and the optimization is performed on $k_1$ and $k_2$ instead as described before. Also, $k_1$ and $k_2$ have to be larger than one to provide the desired damping behavior. Larger values of $k_1$ and $k_2$ will add to the cost and real-estate requirements of the design. Hence, as a rule of thumb, many industries use a k value of 2 or 3 to design a C-RC damping scheme. Also, $k_1$ and $k_2$ are selected as fractional numbers based on the availability of capacitors. In this example, $k_1$ and $k_2$ are selected from the set {1.5, 2, 2.5, 3}. Constraints on $R_1$ and $R_2$ are defined using (13). In (13), M is selected as M=5 to guarantee the RC-path impedance of at least 5 times higher than the C path at the frequency of switching. This will improve the efficiency of the converter by reducing the flow of the switching current through the RC path. Based on this M and using the largest k's, the constraints are derived as 0.4Ω≤$R_1$ and 0.49Ω≤$R_2$. Also, the values of these resistors are restricted to the standard 1% resistor table. The objective of the optimization is $$\min[\max(\Re(v)) + \max(\text{diag}(|v|))^{-1}\Re(v)) + \gamma K] \quad (17)$$

where K=$k_1$+$k_2$. By solving this optimization problem using PSO, $R_1$=1.2Ω, $R_2$=1.3Ω, $k_1$=2, and $k_2$=2.

Controller Design

In an embodiment, proportional-integral (PI) controllers are considered for the current and voltage regulators. Although more advanced types of controllers are applicable, majority of the industries prefer simple analog controllers to achieve cost effectiveness. To design the PI controllers, two approaches can be taken. In the first approach, the linearized model of the system is reduced in order. It has been shown that a reduced order model improves the performance of the controllers designed based on the analytical methods. In the second approach, the order of the model is not reduced and the controller parameters are numerically optimized to achieve the desired performance indices. The second method requires numerical optimization but will deliver the optimal compensator coefficients. In the exemplary embodiments described herein, PI parameters are optimized using the full small signal model of the system (e.g., in Matlab, etc.). In the first step, the current controller has to be designed.

The ZFR converter described herein has multiple current paths that can be regulated. The magnetizing current of the converter, $i_{L_3}$, defines the power flowing through the converter and can be considered as the main current to be regulated. However, $L_3$ is an imaginary inductor and the current of this inductor is not measurable. The current of the primary side of the transformer can be written as $i_{L_3} - i_{T_a} = i_{L_3} - \tilde{i}_{L_1} - a\tilde{i}_{L_2}$. This current is measurable and contains information regarding the current ripples which can be used for fault circuitry and peak current control.

In the exemplary embodiment described herein, the input current is of interest. Input current can be described as $i_{in} = i_{L_1} + i_{L_2} + i_{L_3} - i_{T_a} = (i_{L_1} - \tilde{i}_{L_1}) + (1-a)i_{L_2} + i_{L_3}$ which does not contain the first order switching ripples and has a steady state value of $v_{in}/(d^2 R_o)$. Due to lower ripple contents, this current allows for a better PI controller design with reduced ripple pass-through challenges in analog implementation of proportional controllers. Based on the model developed herein, a selection matrix of $C=[1, 1, 1, 0, 0, 0, 0, 0, -1]$ can extract the input current as $\tilde{i}_{in}(s)/\tilde{d}(s) = C\tilde{x}(s) = C(sI-A)^{-1}B[0, 1]^T$ where $[0, 1]^T$ selects the duty cycle as the input. During the controller design, one should note that the model is derived based on the duty cycle of switching transistor $Q_2$. However, the converter is operating in the boost mode. Hence, the controller requires to have one additional negative sign for stability since $\tilde{i}_{in}(s)/\tilde{d}(s)/s \to 0 < 0$. This PI controller will regulate the current passing through the converter. Knowing the duty cycle, one can directly control the magnetizing current of the converter using this PI controller and without adding a separate current sensor on $T_a$.

By robust tuning of PI parameters (e.g., by using Matlab, etc.), an optimized PI controller for this design is derived as $k_{pi}(1+k_{i_i}/s)$ with $k_{pi}=0.00092$ and $k_{i_i}=14000$. This PI controller generates the small signal variations of $\tilde{d}$ as a function of the current feedback. Meanwhile, the large signal duty cycle, $\bar{d}$ can be calculated as $\bar{d}=v_{in}/v^*_{C_1}$. Therefore, the combined feed-forward and feedback controllers is $$d = \frac{v^*_{C_1}}{R_o i^*_{in}} - k_{pi}\left(1 + \frac{k_{i_i}}{s}\right)(i^*_{in} - i_{in}),$$

which can be written as $$d = v_{in}/v^*_{C_1} - k_{pi}\left(1 + \frac{k_{i_i}}{s}\right)(i^*_{in} - i_{in})$$

to eliminate the dependency on $R_o$ (the superscript * denotes the reference parameter).

Next, by combining the current controller and the small signal of the system (e.g., in Matlab, etc.), a voltage controller is designed for the closed-loop current-controlled example as $k_{p_v}(1+k_{i_v})$ where $k_{p_v}=0.23$ and $k_{i_v}=14000$. Now, the voltage and current controllers are designed and can be implemented as well as the hardware.

Converter Development

This section describes development of the 1 kW 50V to 100V converter described above.

Coupled Inductor Development

It should be noted that the total N×I in the magnetic core of the coupled inductor is $N_a i_T + a^2 N_a i_{L_2} + N_a i_{L_1}$ where $N_a$ is the number of turns for $T_a$ (based on FIG. 6B). Based on the equilibrium point derived in (8), the dc magnetizing term of the core is $N_a v_{in}/d^2 R_o$, which will be added by the ripple terms including the major ripples of $L_3$ as $v_{in}(1-d)T_{sw}/2L_3$. Hence, as the gain of the converter is increased, the magnetizing current increases by a square factor. This is a significant draw back for this converter. However, as long as a reasonable gain is demanded, the total magnetic core required will be smaller than that of a traditional topology offering the same input/output ripples.

In this example, the gain of the converter is set to 2. Hence, the inductor will have to handle slightly more than 20 A without entering saturation. To implement this inductor, an ETD core is wrapped with 12 turns of four parallel Litz wires to construct $T_a$, 12 turns of four parallel Litz wires for $T_c$, and 4 turns of the same Litz wire for $T_b$ (the wire used are rated for 2.5 A). This inductor was tested under a 20 A dc bias to ensure its performance and maintaining its inductance at the maximum load. This test is shown in FIG. 14.

In an aspect, a power circuit includes a switching circuit (e.g., $Q_1$ and $Q_2$, $Q_3$ and $Q_4$, $Q_5$ and $Q_6$, etc.), a main storage element (e.g., $L_{1p}$, where p is an arbitrary phase), and a resonant tank (e.g., $L_{3p}$, $L_{1p}$, and $C_{2p}$, where p is an arbitrary phase). The switching circuit is configured to control a power flow between an input and an output. The main storage element is electrically connected in series with the switching circuit. The resonant tank is electrically coupled to the switching circuit and configured to compensate for switching ripples in the main storage element.

In one form, the power circuit is a converter. In another form, the power circuit is an inverter. In yet another form, the resonant tank comprises a coupled inductor (e.g., $T_{p1}:T_{p2}:T_{p3}$, where p is an arbitrary phase) electrically connected to the switching circuit. In another form, the main storage element comprises an internal magnetizing inductor of a phase transformer (e.g., $T_{a3}$, $T_{b3}$, $T_{c3}$, $T_{a1}$, $T_{b1}$, $T_{c1}$, $T_{a2}$, $T_{b2}$, $T_{c2}$). In yet another form, the resonant tank comprises a coupled inductor (e.g., $L_{2p}$, where p is an arbitrary phase) and capacitor (e.g., $C_{3p}$, where p is an arbitrary phase) electrically connected in series with a secondary winding of the phase transformer. In another form, the power circuit further includes a coupled transformer (e.g., $T_{p1}:T_{p2}$, where p is an arbitrary phase) having a winding electrically connected in series with the switching circuit. In this form, the coupled transformer has a 1:1 ratio with a main winding of the phase transformer and is configured to compensate for switching ripples in voltage at the input of the power circuit. In yet another form, the switching circuit comprises a pair of switches connected in series. In another form, the switches are alternately switched ON and OFF. In yet another form, the switching circuit further includes a converter capacitor (e.g., $C_{2p}$, where p is an arbitrary phase) electrically connected in parallel with the switches. In another form, the power circuit includes a high-frequency ripple filter (e.g., $C_{4p}$, where p is an arbitrary phase) electrically connected in parallel with the resonant tank.

In another aspect, a power conversion circuit includes an input terminal, a coupled inductor (e.g., $T_{p1}:T_{p2}:T_{p3}$, where p is an arbitrary phase), a switching circuit (e.g., $Q_1$ and $Q_2$, $Q_3$ and $Q_4$, $Q_5$ and $Q_6$, etc.), and an output terminal. The input terminal is configured to receive a direct current. The coupled inductor is electrically coupled to the input terminal and has an inherent magnetizing inductance. The switching circuit is electrically coupled to the coupled inductor and is configured to alternate the flow of the direct current through a first winding of the coupled inductor to produce an alternating current in a second winding of the coupled inductor. The alternating current has a first phase. The output terminal is electrically coupled to the coupled inductor and is configured to provide the alternating current. The inherent magnetizing inductance of the coupled inductor is configured to compensate for ripples in the alternating current caused by the alternating flow of the direct current through the first winding of the coupled inductor. In this manner, the alternating current is substantially rippleless (e.g., without ripples) at the first output terminal.

In one form, the power conversion circuit further includes a filtering inductor (e.g., $L_{1p}$, where p is an arbitrary phase) electrically coupled between the input terminal and the first coupled inductor. In another form, the switching circuit includes a plurality of transistors (e.g., $Q_1$ and $Q_2$, $Q_3$ and $Q_4$, $Q_5$ and $Q_6$, etc.) connected in series and a converter capacitor (e.g., $C_{2p}$, where p is an arbitrary phase) electrically connected in parallel with the transistors. In yet another form, the power conversion circuit further includes a resonant tank (e.g., $L_{3p}$, $L_{1p}$, and $C_{2p}$, where p is an arbitrary phase) electrically coupled to the first switching circuit and configured to further compensate for the ripples in the alternating current.

In another form, the power conversion circuit further includes an output ripple canceling inductor (e.g., $L_{2p}$, where p is an arbitrary phase) and an output ripple canceling capacitor (e.g., $C_{3p}$, where p is an arbitrary phase) that are electrically coupled to the coupled inductor and the output terminal. In this form, the output ripple canceling inductor is configured to generate a ramp current that cancels a ramp generated by the inherent magnetizing inductance and the output ripple canceling capacitor is configured to provide a locally floating voltage that is substantially equal to an output voltage of the alternating current at the output terminal.

In yet another form, the power conversion circuit further includes a second coupled inductor, a second switching circuit, a second output terminal, a third coupled inductor, a third switching circuit, and a third output terminal. The second coupled inductor is electrically coupled to the input terminal and has a second inherent magnetizing inductance. The second switching circuit is electrically coupled to the second coupled inductor and is configured to alternate the flow of the direct current through a first winding of the second coupled inductor to produce a second alternating current in a second winding of the second coupled inductor. The second alternating current has a second phase that is different from the first phase. The second output terminal is electrically coupled to the second coupled inductor and is configured to provide the second alternating current. The third coupled inductor is electrically coupled to the input terminal and has a third inherent magnetizing inductance. The third switching circuit is electrically coupled to the third coupled inductor and is configured to alternate the flow of the direct current through a first winding of the third coupled inductor to produce a third alternating current in a second winding of the third coupled inductor. The third alternating current has a third phase that is different from the first and second phases. The third output terminal is electrically coupled to the third coupled inductor and is configured to provide the third alternating current. The inherent magnetizing inductance of the second coupled inductor is configured to compensate for ripples in the second alternating current caused by the alternating flow of the direct current through the first winding of the second coupled inductor. In this manner, the second alternating current is substantially rippleless (e.g., without ripples) at the second output terminal. The inherent magnetizing inductance of the third coupled inductor is configured to compensate for ripples in the third alternating current caused by the alternating flow of the direct current through the first winding of the third coupled inductor. In this manner, the third alternating current is substantially rippleless (e.g., without ripples) at the third output terminal.

A method of canceling current ripples in accordance with yet another aspect of the present disclosure includes receiving an electrical direct current at a coupled inductor via an input terminal. A direction of the flow of the electrical direct current is switched through a first winding of the coupled inductor to generate an electrical alternating current in a second winding of the coupled inductor. An inherent magnetizing inductance of the coupled inductor compensates for ripples in the electrical alternating current caused by the switching. The compensated electrical alternating current is provided at an output terminal of the coupled inductor.

In one form, the method further includes an inductor electrically coupled to the coupled inductor and the output terminal generating a ramp current that cancels a ramp generated by the inherent magnetizing inductance of the coupled inductor. In another form, a resonant tank compensates for the ripples in the electrical alternating current.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. A power conversion circuit comprising:
   an input terminal configured to receive a direct current;
   a first coupled inductor electrically coupled to the input terminal, the first coupled inductor having a first inherent magnetizing inductance;
   a first switching circuit electrically coupled to the first coupled inductor, the first switching circuit configured to alternate a flow of the direct current through at least a first winding of the first coupled inductor to produce a first alternating current in at least a second winding of the first coupled inductor, the first alternating current having a first phase;
   a first output terminal electrically coupled to the first coupled inductor, the first output terminal configured to provide the first alternating current; and an output ripple canceling inductor and an output ripple canceling capacitor electrically coupled to the first coupled inductor and the first output terminal,
wherein the first inherent magnetizing inductance of the first coupled inductor is configured to compensate for ripples in the first alternating current caused by the alternating flow of the direct current through the at least first winding of the first coupled inductor such that the first alternating current is substantially rippleless at the first output terminal,
wherein the output ripple canceling inductor is configured to generate a ramp current that cancels a ramp generated by the first inherent magnetizing inductance, and
wherein the output ripple canceling capacitor is configured to provide a locally floating voltage substantially equal to an output voltage of the first alternating current at the first output terminal.

2. The power conversion circuit of claim 1, further comprising a main storage element electrically connected in series with the first switching circuit and comprising an internally magnetizing inductor of a phase transformer, a resonant tank electrically coupled to the first switching circuit, and the first coupled inductor and a capacitor electrically connected in series with a secondary winding of the phase transformer.

3. The power conversion circuit of claim 1, further comprising a main storage element electrically connected in series with the first switching circuit, a resonant tank electrically coupled to the first switching circuit, and a coupled transformer having a winding electrically connected in series with the first switching circuit, said coupled transformer having a 1:1 ratio with a main winding of a phase transformer and configured to compensate for switching ripples in voltage at the input of the power conversion circuit.

4. The power conversion circuit of claim 1, wherein the first switching circuit comprises a pair of series-connected switches.

5. The power conversion circuit of claim 4, wherein the switches of the first switching circuit are alternately switched ON and OFF.

6. The power conversion circuit of claim 4, wherein the first switching circuit further comprises a converter capacitor electrically connected in parallel with the switches.

7. The power conversion circuit of claim 1, further comprising a main storage element electrically connected in series with the first switching circuit, a resonant tank electrically coupled to the first switching circuit, and a high frequency ripple filter electrically connected in parallel with the resonant tank.

8. The power conversion circuit of claim 1, further comprising a first filtering inductor electrically coupled between the input terminal and the first coupled inductor.

9. The power conversion circuit of claim 1, wherein the first switching circuit comprises a plurality of series-connected transistors and a converter capacitor electrically connected in parallel with the plurality of transistors.

10. The power conversion circuit of claim 1, further comprising a resonant tank electrically coupled to the first switching circuit and configured to further compensate for the ripples in the first alternating current.

11. A power conversion circuit comprising:
an input terminal configured to receive a direct current;
a first coupled inductor electrically coupled to the input terminal, the first coupled inductor having a first inherent magnetizing inductance;
a first switching circuit electrically coupled to the first coupled inductor, the first switching circuit configured to alternate a flow of the direct current through at least a first winding of the first coupled inductor to produce a first alternating current in at least a second winding of the first coupled inductor, the first alternating current having a first phase;
a first output terminal electrically coupled to the first coupled inductor, the first output terminal configured to provide the first alternating current;
a second coupled inductor electrically coupled to the input terminal, the second coupled inductor having a second inherent magnetizing inductance;
a second switching circuit electrically coupled to the second coupled inductor, the second switching circuit configured to alternate the flow of the direct current through at least a first winding of the second coupled inductor to produce a second alternating current in at least a second winding of the second coupled inductor, and the second alternating current having a second phase different from the first phase;
a second output terminal electrically coupled to the second coupled inductor, the second output terminal configured to provide the second alternating current;
a third coupled inductor electrically coupled to the input terminal, the third coupled inductor having a third inherent magnetizing inductance;
a third switching circuit electrically coupled to the third coupled inductor, the third switching circuit configured to alternate the flow of the direct current through at least a first winding of the third coupled inductor to produce a third alternating current in at least a second winding of the third coupled inductor, and the third alternating current having a third phase different from the first and second phases; and
a third output terminal electrically coupled to the third coupled inductor, the third output terminal configured to provide the third alternating current;
wherein the first inherent magnetizing inductance of the first coupled inductor is configured to compensate for ripples in the first alternating current caused by the alternating flow of the direct current through the at least first winding of the first coupled inductor such that the first alternating current is substantially rippleless at the first output terminal,
wherein the second inherent magnetizing inductance of the second coupled inductor is configured to compensate for ripples in the second alternating current caused by the alternating flow of the direct current through the at least first winding of the second coupled inductor such that the second alternating current is substantially rippleless at the second output terminal, and
wherein the third inherent magnetizing inductance of the third coupled inductor is configured to compensate for ripples in the third alternating current caused by the alternating flow of the direct current through the at least first winding of the third coupled inductor such that the third alternating current is substantially rippleless at the third output terminal.

12. A method of canceling current ripples, comprising:
receiving an electrical direct current at a coupled inductor via an input terminal;
switching a direction of a flow of the electrical direct current through at least a first winding of the coupled inductor to generate an electrical alternating current in at least a second winding of the coupled inductor, the electrical alternating current having a first phase;

compensating, by an inherent magnetizing inductance of the coupled inductor, for ripples in the electrical alternating current caused by said switching;

providing the compensated electrical alternating current at an output terminal of the coupled inductor; and generating a ramp current, by an inductor electrically coupled to the coupled inductor and the output terminal, that cancels a ramp generated by the inherent magnetizing inductance of the coupled inductor.

13. The method of claim 12, further comprising compensating, by a resonant tank, for the ripples in the electrical alternating current.

* * * * *